(12) United States Patent
Hallam et al.

(10) Patent No.: US 9,171,723 B2
(45) Date of Patent: Oct. 27, 2015

(54) FORMATION OF LOCALISED MOLTEN REGIONS IN SILICON CONTAINING MULTIPLE IMPURITY TYPES

(71) Applicant: NEWSOUTH INNOVATIONS PTY LIMITED, UNSW Sydney (AU)

(72) Inventors: Brett Jason Hallam, Bexley (AU); Catherine Emily Chan, Randwick (AU); Stuart Ross Wenham, Cronulla (AU); Adeline Sugianto, Malabar (AU); Pei Hsuan Lu, Rockdale (AU); Valantis Vais, Beverley Park (AU)

(73) Assignee: NewSouth Innovations Pty Limited, UNSW Sydney, NSW (AU)

( * ) Notice: Subject to any disclaimer, the term of this patent is extended or adjusted under 35 U.S.C. 154(b) by 0 days.

(21) Appl. No.: 14/381,175

(22) PCT Filed: Oct. 25, 2012

(86) PCT No.: PCT/AU2012/001302
§ 371 (c)(1),
(2) Date: Aug. 26, 2014

(87) PCT Pub. No.: WO2013/142892
PCT Pub. Date: Oct. 3, 2013

(65) Prior Publication Data
US 2015/0017793 A1    Jan. 15, 2015

(30) Foreign Application Priority Data

Mar. 29, 2012   (AU) .................................. 2012901267

(51) Int. Cl.
*H01L 21/24*    (2006.01)
*H01L 21/40*    (2006.01)
*H01L 21/225*   (2006.01)
(Continued)

(52) U.S. Cl.
CPC ........ *H01L 21/2254* (2013.01); *H01L 21/2225* (2013.01); *H01L 21/268* (2013.01); *H01L 21/2636* (2013.01); *H01L 31/022425* (2013.01); *H01L 31/068* (2013.01);
(Continued)

(58) Field of Classification Search
USPC ........................................................ 438/540
See application file for complete search history.

(56) References Cited

U.S. PATENT DOCUMENTS 4,364,778 A    12/1982   Leamy et al.

OTHER PUBLICATIONS

International Search Report and the Written Opinion of the International Searching Authority, Intl. Applic No. PCT/AU2012/001302, Australian Patent Office, Dec. 2012, 13 pages.

*Primary Examiner* — Asok K Sarkar

(57) ABSTRACT

A method for creating an inwardly extending impurity distribution profile in a substrate comprising crystalline silicon material having a background doping of a first impurity type, comprising: a) providing one or more additional impurity sources with at least two different types of impurity atoms within the substrate or in proximity to the surface of the substrate, with each of these impurity atoms having different diffusion coefficients or segregation coefficients; b) locally melting a point on the surface of the substrate with a laser, whereby the at least two different types of impurity atoms are incorporated into the melted silicon material; c) removing the laser to allow the silicon material to recrystallize; d) controlling a rate of application and/or removal of the laser to control the creation of the impurity distribution profile, with different distribution profiles for each of the at least two types of impurity atoms in the recrystallized material.

25 Claims, 20 Drawing Sheets

(51) Int. Cl.
  *H01L 21/268*  (2006.01)
  *H01L 31/18*  (2006.01)
  *H01L 31/0224*  (2006.01)
  *H01L 31/068*  (2012.01)
  *H01L 21/22*  (2006.01)
  *H01L 21/263*  (2006.01)

(52) U.S. Cl.
  CPC ....... *H01L 31/1804* (2013.01); *H01L 31/1864* (2013.01); *Y02E 10/547* (2013.01)

FORMATION OF LOCALISED MOLTEN REGIONS IN SILICON CONTAINING MULTIPLE IMPURITY TYPES

INTRODUCTION

The present invention relates generally to the field of photovoltaics and in particular, the invention provides new ways of forming various device structures by controlling the type and concentration of impurities at different depths from the surface of the silicon wafer.

BACKGROUND TO THE INVENTION

Many desirable solar cell device structures cannot be formed using silicon wafers due to the inability to control the type and concentration of impurities more than a few microns from the surface (other than the wafer's background doping which is inevitably quite uniform throughout the wafer). Semiconductor layers formed by deposition and growth processes (such as Plasma Enhanced Chemical Vapour Deposition, Ion-assisted deposition, E-beam deposition, sputtering, solid phase crystallisation of deposited amorphous layers, liquid phase epitaxial growth etc.) provide the opportunity of controlling the impurity type and concentration throughout the thickness of the semiconductor material or layers; however these are often costly and lead to the formation of lower quality silicon. Whilst these techniques provide a method for controlling the dopant concentration and type throughout the entire thickness of the grown device (which is potentially greater than 4 um), such methods cannot be applied to conventional silicon wafers which do not undergo deposition and growth processes whereby the material can be tailored at each layer.

Several techniques have been developed for modifying the doping concentration and type within close proximity of silicon wafer surfaces, although until now, no such technique has been able to control the doping more than about 4 microns from the wafer surface. Many silicon solar cells use various thermal processes to incorporate dopants into the surface of the silicon wafer, often with junction depths of less than 1 micron. Such diffusions may be fabricated by various methods. One such method which is normally used for the fabrication of conventional screen printed solar cells is the use of thermal diffusions in furnaces. These diffusion processes typically only allow dopants to penetrate less than 200 nm deep, due to the difficulty in achieving greater depths without lengthy and excessively high temperature processing. Ion implantation is another technique used for introducing dopants into a silicon wafer. However, this causes substantial damage to the material due to the high energy bombardment of the atoms. To create deep junctions, the power must be increased which leads to further damage being caused. As a result, junction depths are typically kept to <1 um, and even then they are specially treated to minimize formation of defects.

The inability to control the type and concentration of impurities more than a few microns from the silicon wafer surface greatly limits the ability to form many device structures and in particular, many structures that would enhance the performance and durability of photovoltaic devices. In an attempt to control doping deeper within the wafer, many approaches have been developed for modifying the wafer surface such as with the formation of grooves and holes to enable the surface to penetrate to deep within the wafer (more than 4 microns from the original surface), thereby allowing dopants to enter such surfaces and effectively allow dopants to be introduced into regions deep within the wafer. Examples include the Buried Contact Solar Cell and the Emitter Wrap-Through Cell. Although many innovative device structures can be formed in this way, it does not overcome the fundamental limitation that the impurities are still within several microns of the semiconductor surface. This is an important limitation for many reasons such as when forming a heavily doped junction beneath a metal contact formed on the surface of the semiconductor. It is desirable to have such junctions as deep as possible to minimise the dark saturation current contribution from the metal/silicon interface and also to improve the durability of the device during subsequent thermal processes or during operation in the field where the greater distance from the metal to the junction makes it more difficult for the metal to penetrate to the junction and damage the device.

Laser doping can also be used to form heavily doped layers or regions. By applying heat to the desired regions, localised diffused regions are formed and diffusion can occur through either solid state or liquid state diffusion. For the laser doping process, conventional 532 nm wavelength Q-switched lasers with nanosecond pulse lengths are typically used. If performed using solid state diffusion, the junction depth will be substantially smaller due to the lower diffusion coefficients of dopants in the solid phase than that of the liquid phase. However if the diffusion is performed in the liquid phase, the pulse frequency of conventional Q-switched lasers results in the semiconductor material solidifying in between successive pulses. As a result, additional pulses merely melt the same volume of silicon and do not lead to a deeper junction. Using such lasers, to obtain a deeper junction depth, higher energy pulses must be used. However if the energy is too high, this leads to ablation of the silicon material which will result in the formation of grooves; voids and possibly even cracks, again preventing the achievement of doping of the silicon more than 4 microns from the surface. As a result, junction depths of more than 4 microns cannot be obtained using these lasers. Even when using longer wavelength Q-switched lasers (such as 1064 nm) which have a deeper absorption depth, deep junctions cannot be obtained. Although the longer wavelength light is absorbed over a larger volume of the solid silicon which could allow for larger diffusion depths, once the laser illumination melts the silicon, the absorption of infrared by the molten region is greatly enhanced which causes the ablation of the surface layer.

SUMMARY

A method is provided for creating an impurity distribution profile in a substrate comprising crystalline silicon material having an initial background doping of a first impurity type, the impurity distribution profile extending inwardly from a surface of the substrate, the method comprising a) providing one or more impurity sources in addition to the background doping of the substrate, the one or more impurity sources in combination containing at least two different types of impurity atoms, each of the one or more impurity sources being within the substrate or in proximity to the surface of the substrate and each of the at least two different types of impurity atom having a different diffusion coefficient or a different segregation coefficient;

b) locally heating the silicon material and the one or more impurity sources within the substrate or in proximity to the surface of the substrate by applying a laser heat source to heat a point on the surface of the substrate to melt a volume of the silicon material below the point on the surface of the substrate whereby the at least two different types of impurity atoms of the at least one source are incorporated into the melted silicon material;

c) cooling the melted silicon material by removing the heat source from the point on the surface of the substrate to allow the melted silicon material to recrystallise;

d) controlling a rate of application and/or removal of the laser heat source and a duration for which the heat source is applied to thereby control the rate and depth of melting, a duration for which the silicon remains molten and a rate of recrystallisation of the silicon material to control redistribution of the at least two types of impurity atoms within the melted silicon by diffusion while melted or by segregation during recrystallization to thereby create the impurity spatial distribution profile of each of the at least two types of impurity atom in the recrystallised silicon material comprising a different spatial distribution profile of each of the at least two types of impurity atom.

The method may further comprise controlling a rate of application and/or removal of the heat source and duration for which the heat source is applied to cause the melting and recrystallisation of the silicon material at any point in the substrate to occur only once. In various embodiments the two or more impurity atom types may be provided such that:

i) all of the two or more impurity atom types are of a different type to the first impurity type; or ii) the at least one impurity source comprises a source of the first impurity type in addition to the background doping of the substrate.

The step to melt the volume of the silicon material below the point on the surface of the substrate may be maintained for a period sufficient to cause lateral doping of unmelted material surrounding the melted silicon material by solid phase diffusion in the unmelted surrounding material.

Preferably the heating step will be performed using a continuous wave (CW) laser, but a pseudo CW laser (otherwise referred to as a quasi CW Laser) with laser beam pulsed at very high frequencies above 5 MHz and preferably above 10 MHz may be used such that the pulse frequency ensures that the silicon remains molten between pulses. Where a pseudo CW laser is used, the laser pulses of the pseudo CW laser may be temporally shaped and/or the temporal pulse length extended to enable the formation of the localised regions of melted silicon material that extend into the silicon by more than 4 microns from the silicon surface.

During the heating step the melted silicon material may extend to a depth whereby diffusion of dopants from the melted silicon material reaches a buried layer to cause a connection between the buried layer and the melted silicon material after recrystallisation of the melted silicon material and forming a junction between the melted silicon material and oppositely doped material surrounding the melted silicon material after its recrystallisation. Preferably after recrystallisation the silicon material immediately on either side of the junction between the melted silicon material and oppositely doped material surrounding the melted silicon material will have a dopant concentration below $1 \times 10^{18}/cm^3$ and more preferably below $5 \times 10^{17}/cm^3$ to ensure good junction performance.

In other embodiments the different spatial distribution profile of each of the at least two types of impurity atoms in the recrystallised silicon material results in one or more junctions being formed within or at a boundary of the melted material after recrystallisation. The different spatial distribution profile of each of the at least two types of impurity atoms in the recrystallised silicon material may also result in a reduction in an impurity concentration of at least one impurity type in at least a part of the melted material after recrystallization from the average concentration of the impurity within the molten silicon. The reduction in the impurity concentration may occur at least in a region adjacent to a junction formed in or at a boundary of the recrystallised silicon material. Alternatively the different spatial distribution profile of each of the at least two types of impurity atom may result in an increase in the concentration of an impurity in at least a part of the melted material after recrystallisation from the average concentration of the impurity within the molten silicon. The increase in the impurity concentration may also occur at least in a region adjacent to a junction formed in or at a boundary of the recrystallised silicon material. Therefore in one particularly useful embodiment, a concentration profile of one of the at least two different types of impurity atoms may be controlled to minimise its concentration near a junction and to maximise its concentration near the surface of the melted region after recrystallisation such that junction performance is not adversely affected. The higher concentration near the surface may be used to advantage or the surface region may be etched back if the higher concentration is not useful. Alternatively a concentration profile of one of the at least two different types of impurity atoms may advantageously be controlled to maximise its concentration near a junction and to minimise its concentration near the surface of the melted region after recrystallisation if for example a region of junction is to be disabled or shorted out. In these applications the one of the at least two different types of impurity atoms may be a metal impurity atom such as nickel. In the case where the impurity atom is nickel, the cooling step may be controlled whereby the segregation coefficient of the nickel during solidification ensures minimal metal contamination occurs within the material first to crystallise (i.e. near a junction) but with very high concentration of metal atoms within the last material to crystallise (i.e. at the surface) such that the nickel forms an NiSi diffusion barrier and nucleates subsequent metal plating. The removal of the laser heat source used to heat the point on the surface of the substrate to melt the volume of the silicon material may be controlled to reconfigure the metal atoms to a suitable form of NiSi which will act as the diffusion barrier to copper and will nucleate copper plating. Alternatively, after recrystallization, a thermal anneal may be performed at 350-400° C. to reconfigure the metal atoms into the suitable form of NiSi which will act as a diffusion barrier to copper and will nucleate copper plating.

A concentration of one of the one or more types of impurity atoms may vary by at least a factor of two and preferably at least 10 across the recrystallised silicon material. Variations in either the diffusion coefficients and/or segregation coefficients of the at least two different types of impurity atoms within the molten silicon may lead upon cooling to the ratio of concentrations of the at least two different types of impurity atoms to vary from above unity to below unity in different regions of the melted silicon material after recrystallisation. During the localised heating step the melted silicon material may extend from the surface of the silicon substrate to a depth of between 1 and 20 microns but preferably at least 4 microns and also preferably less than 10 microns.

The at least one impurity source may contribute at least two but optionally at least three different types of impurity atoms to the melted silicon material region during the heating step, in addition to the background doping of the substrate, such that each of the at least three different types of impurity atoms have an average concentration within the melted silicon material of at least $1 \times 10^{15}$ atoms/cm³. Alternatively, the at least one impurity source may contribute at least two different types of impurity atoms to the melted silicon material region during the heating step, in addition to the background doping of the substrate, such that each of the at least two different types of impurity atoms have an average concentration within the melted silicon material of at least $1\times10^{16}$ atoms/cm$^3$ or in some cases at least $1\times10^{17}$ atoms/cm$^3$.

The at least two different types of impurity atoms may be selected with different segregation coefficients such that a junction is formed within the resolidified region during the solidification process. Also if the melting and cooling of the melted silicon material is performed sufficiently rapidly to prevent complete mixing of the dopants, the different diffusion coefficients of the at least two different types of impurity atoms may be selected to cause a junction to be formed within the recrystallised material. The at least two different types of impurity atoms can also be selected with diffusion coefficients and segregation coefficients which together allow the dopant profiles to be controlled such that a junction is formed within the recrystallised region.

The cooling of the molten silicon at a given point may be arranged to cause solidification of the silicon at a rate fast enough in relation to the diffusion coefficient of given one of the at least two types of impurity atom to prevent segregation of the impurity. The silicon at a given point may also be kept molten for a duration less than the time required for a given one of the at least two types of impurity atom to fully diffuse through the molten region prior to re-solidification. Further the silicon at a given point may also be kept molten for a duration greater than or equal to a time required for a given one of the at least two types of impurity atom to fully diffuse in the molten silicon such that the maximum depth of impurities is limited by the depth of the molten region.

The cooling of the silicon at the given point may be arranged to cause solidification of the silicon at a rate fast enough in relation to the diffusion coefficient of the given impurity to prevent segregation of the impurity atoms.

The rate of solidification may be enhanced by rapidly removing the heat source using a shutter in the path of the laser beam. The shutter is an optoelectronic modulator. The beam may also be held stationary relative to the silicon substrate whilst forming each molten region, and applying the laser to the silicon substrate for a predetermined time maintaining the silicon in the molten state for a time required to result in the desired depth of molten silicon and impurity distribution and subsequently interrupting the laser beam by operating the shutter to abruptly remove the laser beam from the molten silicon.

The method may be used to allow contact to be made to an underlying region through an emitter or surface layer by forming a molten region through the emitter or surface layer such that upon recrystallization the molten region forms a region of opposite polarity to the surface layer so as to form contact to the buried layer also of opposite polarity to the emitter or surface layer. The method of forming a contact to the underlying region may be used to form an interdigitated contact structure or a contact through a floating junction or to connect parallel layers of the same polarity located at different distances from the surface of the substrate. In an extreme case the regions of recrystallised melted silicon material may be formed to connect a silicon region at one surface of the substrate to a silicon region at an opposite surface of the substrate, where the substrate comprises a wafer or silicon layer of less than 20 microns thickness. The method can also be used to connect regions even further apart, where the substrate comprises a wafer or silicon layer of less than 40 microns thickness, by creating two regions of recrystallised melted silicon material extending from opposite surfaces of the substrate to interconnect with each other between the surfaces to connect a silicon region at one surface of the substrate to a silicon region at the opposite surface of the substrate.

In other embodiments such as contacts to surface regions or regions close to a surface, the region of melted silicon material may extend to a depth of at least 4 um below the point on the surface of the substrate. In particular the localised regions of melted silicon material may be used to form heavily doped regions beneath metal contacts. The contacts in some cases might be point contacts.

Solid state diffusion of dopants from the region of melted silicon material into an adjacent solid region can be promoted by keeping the silicon in the region of melted silicon material molten for an extended period. Solid state diffusion of dopants may also be promoted to diffuse dopants into the region of melted silicon material from an adjacent solid region with extended heating of the melted region. Further solid state diffusion of dopants may be promoted to diffuse dopants from a surface dopant source or a dielectric layer adjacent to the molten region into a solid region adjacent to the region of melted silicon material if the heating of the melted region is extended sufficiently.

The power of the laser beam may be varied during the period of melting of a given point in the silicon. Accordingly the method may include the steps of:
  a) operating the laser to provide a first beam energy for a first predetermined period of time to allow for sufficient mixing of one of the at least two different types of the impurity atoms within a first molten region at the given point;
  b) increasing the beam power of the laser for a period of time after the first predetermined period to cause an increase in the volume of the molten region beyond the first molten region, wherein distribution of the one of the at least two different types of the impurity atoms within this newly molten volume beyond the first molten region is limited by the diffusion coefficients of the respective impurity type; and
  c) reducing the beam power of the laser to rapidly cool part or all of the newly molten volume beyond the first molten region at a rate to prevent segregation of the one of the at least two different types of the impurity atoms and to ensure that the diffusion coefficients determine a spatial impurity profile of the one of the at least two different types of the impurity atoms in part or all of the increased molten volume beyond the first molten region. The rapid cooling may also be continued while a part of the first molten region cools to result in a uniform spatial impurity profile of the one of the at least two different types of the impurity atoms between the first molten region and the increased molten area. During solidification of the first molten region, the cooling rate may be reduced whereby a part of the spatial impurity profile of the one of the at least two different types of the impurity atoms in the first molten region may be determined by the segregation coefficient of the one of the at least two different types of the impurity atoms. The laser may be a pulsed laser and the laser energy may be varied by altering the temporal pulse shape. The laser may also be a pseudo CW laser and the beam energy of the laser may be varied by varying the temporal pulse shape. The pseudo CW laser may also have its beam energy varied by varying a pulse frequency over time, by controlling a shutter in the beam path, by temporal beam shaping, such as by shaping the temporal power profile of beam of the laser using a shutter. The laser may also be a CW laser and the beam temporal power profile experienced at a point on the surface of the substrate may be varied by moving the beam relative to the surface and varying the beam spatial power profile in the direction of relative travel.

The rate of solidification of a molten region of the silicon may be controlled to be slow enough in relation to the diffusion coefficient of one of the at least two different types of the impurity atoms to allow segregation of one of the at least two different types of the impurity atoms.

The rate of solidification of a molten region of the silicon may also be controlled to be varied over time such that during a first part of the solidification process the solidification occurs at a rate fast enough in relation to the diffusion coefficient of one of the at least two different types of the impurity atoms that segregation cannot occur, and in other parts of the solidification process the solidification occurs at a rate slow enough in relation to the diffusion coefficient of the one of the at least two different types of the impurity atoms that segregation can occur.

The laser pulses of a pulsed laser may be temporally shaped and/or the pulse length extended to enable the formation of localised regions of melted silicon material that extend into the silicon by more than 4 microns from the silicon surface.

BRIEF DESCRIPTION OF THE DRAWINGS

Embodiments of the invention will now be described in detail with reference to the accompanying drawings in which.

DETAILED DESCRIPTION

Figure 1:
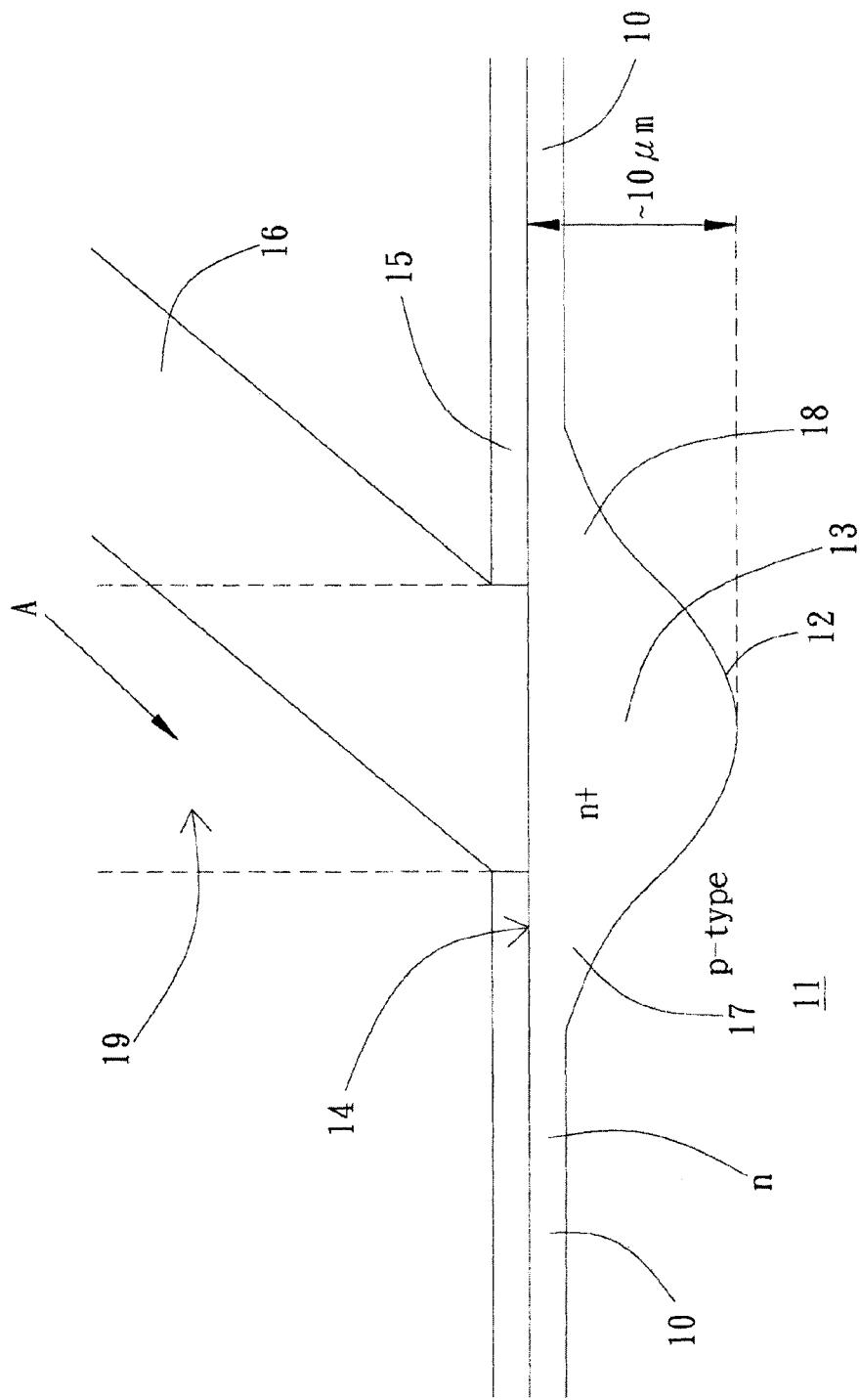
FIG. 1 diagrammatically illustrates a cross section of a laser doped line where a deep p-n junction is formed at a lower extremity of a melt region showing the spatial distribution of the melt region.

There are many advantages associated with the formation of deep junctions and the control of impurity types and concentrations well away from the silicon surface if one can do so without significantly changing the surface of the semiconductor material. However, in view of the limitations of the various doping techniques described above, it appears that such control of impurities can only take place in the liquid phase, allowing impurities to diffuse sufficiently rapidly so as to modify their concentrations in areas close to the silicon surface and up to tens of microns from the silicon surface. In order to successfully achieve the desired outcome, the silicon must be melted in a very controllable fashion and with care taken during the solidification of the semiconductor material so as not to cause a substantial generation of defects or even cracks. In particular, control of impurities in localised areas to depths of more than 4 microns from the silicon surface is challenging due to the need to avoid ablation of the silicon from the surface while still providing sufficient energy over a long enough period of time to allow the molten region to extend to the required depth. When applying a localised heat source, it is inevitable that the molten region extends in all directions into the silicon, both perpendicularly to and parallel to the surface including regions outside the heat illuminated area. To get significant depth (e.g. >4 microns), large amounts of heat energy are therefore required as the volume needing to be made molten becomes typically more than a magnitude greater than the volume traditionally made molten during conventional laser doping processes. This is because for a localised heat source applied to the surface, the molten volume tends to increase with the cube of the distance into the silicon from the surface. For example, a 5 micron laser spot size melting silicon, typically to a depth of 1 micron during laser doping, melts a volume of silicon approximately equal to $20\times10^{-18}$ m$^3$. In comparison, to melt the silicon to a depth of 10 microns using the same spot size, a volume of silicon well in excess of $2,000\times10^{-18}$ m$^3$ needs to be melted, an increase of more than two orders of magnitude. The heating profile for the localised exposed area to the heat source needs to be carefully controlled, with the interface area between the molten and solid regions of silicon also increasing by as much as two orders of magnitude during the process of achieving a depth to the melted silicon in the range 4-20 microns from the illuminated surface. As this interface area increases, the energy supplied to the illuminated surface preferably increases to supply the increasing conduction and radiative heat losses as well as the rapidly increasing latent heat required to continue melting further silicon to increase the depth of the melt. Once the desired depth is achieved, it is preferable to slightly reduce the illuminated power to prevent further melt expansion, following which a gradual reduction in illuminated power is preferable to allow gradual and controlled solidification of the molten silicon by liquid phase epitaxial growth in a way that minimises defect generation and even possible crack formation due to the change in density during the phase change.

Furthermore, it is usually advantageous to form such localised molten regions through a surface coating on the silicon such as a dielectric layer of silicon nitride used to passivate the silicon surface or act as an antireflection coating or hydrogen source for material passivation. Such surface coatings often melt or decompose at temperatures well below the vaporisation temperature for silicon. This places further constraints on the melting process, since large amounts of energy are required to melt the desired volumes and provide for the thermal conduction and radiative losses, but while simultaneously keeping the surface temperature below the decomposition temperature of any surface layers so as to retain their integrity in areas not directly exposed to the heat source.

The time varying heat source for a particular localised location on the wafer surface can be achieved in several ways. Firstly, the intensity of the heat source illuminating the location can be ramped up and then down appropriately at the required rate by varying the beam power temporally in order to achieve the desired outcome and depth to the melt. Alternatively, the equivalent effect for a given location can be achieved through the use of a spatially varying heat source that is scanned across the particular location at the required rate to again give the required temporal heating profile. For example a line source such as a CW line laser could be progressively scanned from one side of a wafer to the other. The spatial power distribution of the laser beam in the direction of travel could be Gaussian so as the power level applied at any given point will initially be low but will then increase to a maximum before decreasing again in a timeframe determined by the scan speed and length of the laser beam on the surface of the silicon. As the beam passes, the given point then gradually cools at a rate again determined by the scan speed and length of the laser beam on the surface of the silicon. Similarly, a heat source such as a CW laser with a spatially varying power density profile such as a Gaussian profile could also be scanned in a way that similarly provides the required ramp up and ramp down in heat delivered to a given location on the surface to achieve the desired melt depth without ablating silicon or undesirably damaging any surface layers such as dielectric passivating layers. In this situation however, the scan speed and intensity of the heat source are of great importance. If however the power profile of the heat source is not significantly spatially varying but is instead say a "top hat" distribution, the desired ramp up and ramp down rate of heat delivered to a particular location can still be achieved through appropriately scanning it towards and then away from the particular location at which the silicon is to be melted to the particular depth. In this case, some of the heat supplied to the particular location is received from the adjacent regions via conduction within the silicon. For example, FIG. 1 diagrammatically illustrates an example of a surface region of a silicon wafer 11 having a surface emitter region 10 and where a junction 12 has been formed under a doped line 13 to a depth of about 10 microns using a spot laser with beam diameter of about 20 microns scanned over the surface 14 in the direction into the page. A much shallower melt 17, 18 is formed to the right and left of the illuminated area, by heat conducting laterally through the silicon to form an extended melt region on the silicon surface underneath the SiN antireflection layer 15 on either side of the opening 16 in the SiN layer. Considering the cross section profile of the junction, if the beam were to travel from left to right, it can be appreciated that the silicon would melt ahead of the laser beam by a distance and depth of up to several microns depending on the scanning speed of the laser and its power. Such a scanning approach can therefore be used to controllably deliver and ramp the power to a specific location ahead of direct illumination by the beam, with peak power being supplied when the beam is directly incident on the location. Similarly, the appropriate scan rate will allow the molten silicon at this location to gradually and controllably cool as necessary to achieve good quality liquid phase epitaxial growth of the solidifying silicon.

The scanning approach, with or without spatial variation in power across the laser beam, can also work for a single small region or location where it is preferable to only melt the silicon a small distance in each direction. This can be achieved by shading adjacent regions from the heat source. As the heat source progressively scans across the unshaded region, more and more energy is progressively delivered to the exposed area, again determined by the intensity in the heat source and the scan speed. This approach can be used to restrict the area over which the silicon is melted to the desired depth, with significantly reduced depth in adjacent regions compared to the case when the shading is not used. This can be used to make significantly smaller feature sizes, determined primarily by the size of the unshaded regions, while still achieving deep melts.

For more than two decades, industrial solar cells have aimed at using heavily doped regions below the metal contacts to form a selective emitter structure, similar to that of the world record holding PERL solar cell. Recent advancements using laser doping have shown that this method is very compatible with forming such selective emitter structures or heavily doped regions in commercial production, provided the depth from the wafer surface that such dopants need to be located is not greater than several microns. The use of such heavily doped regions beneath metal contacts has several benefits including reduction of the contact resistance between the metal and underlying silicon, reduced dark saturation current contribution from the metal/silicon interface by shielding it from the active parts of the device, and improved durability by making it more difficult for the metal to penetrate to the junction region. However conventional approaches for forming heavily doped regions in the surfaces of silicon wafers are limited to depths for the dopants from the wafer surface of typically one micron or less and in extreme circumstances, using processing conditions not compatible with commercial manufacturing, several microns depth has been achieved.

By using the preferred surface heating regime such as with a scanning continuous wave laser, localised molten regions containing multiple impurity types (atoms other than silicon) can be formed so that during heating and cooling, variations in diffusion coefficients and segregation coefficients of the various impurities can be used to advantage to form various structures in the solidified silicon within the region that was molten. To be of use in this way, at least two different types of impurity atoms should be included within the localised molten region, whereby the source of the impurities could be an externally applied impurity source, impurities within a surface dielectric layer, impurities already diffused into the wafer surface or even impurities already present within the silicon wafer when formed. Examples of externally applied impurity sources include spin-on impurity sources, spray-on sources of impurities such as dopant or metal ion containing solutions, gaseous sources, liquid sources and solid sources deposited onto or held nearby the wafer surface. To be of use, impurity concentrations within the localised molten regions need to each be within the range of $1\times10^{15}$ cm$^{-3}$ to $1\times10^{22}$ cm$^{-3}$ and preferably within the range of $1\times10^{16}$ cm$^{-3}$ to $1\times10^{21}$ cm$^{-3}$. Through the use of variations in the diffusion coefficients of the different impurities while the silicon is molten and through the use of variations in the segregation coefficients of the different impurities during liquid phase epitaxial growth of the molten silicon during cooling, the ratio of concentrations between the impurities can be significantly changed. This allows the formation of a range of different device structures depending on the number, types and concentrations of impurities within the molten silicon as well as the heating and cooling regimes used. Ratios of concentrations of the impurities can easily change by more than 100% (factor of two) and are even likely to change by more than 1000% (a factor of 10) between different regions once the molten silicon has solidified and in many cases, the impurity type in highest concentration can change from one impurity type in one region of the resolidified silicon to another of the impurities in another region of the molten silicon once it has solidified. Such regions will in general be heavily doped with at least one impurity type being a dopant with depths of such regions in the range of 1-20 microns (preferably at least 4 microns and also preferably less than 10 microns) with doping in the lateral direction from the edge of the region exposed to the heat source of a similar magnitude as the depth.

Of particular importance is the length of time that the silicon remains molten to allow the manipulation of impurity profiles through diffusion coefficients and segregation during the recrystallization process. For various embodiments, the silicon should remain molten for a period of at least 1 microsecond and preferably for a period of at least 2 microseconds. In some embodiments the silicon may remain molten for as long as 100 microseconds and possibly more than 1 second. To allow the silicon to remain molten for such time, it is preferable to use a CW laser, or a pulsed laser or a very high frequency (>5 MHz) Q-switched laser such that the silicon does not resolidify between successive pulses. The use of such lasers may result in a junction depth of more than 4 microns. Alternatively, techniques such as extending the pulse length or modifying the temporal pulse shape may be used to allow the silicon to remain molten for a sufficient amount.

Using such methods, a range of benefits to the semiconductor device and innovative device structures can be achieved. The following provides a range of examples of innovative structures that can be formed as part of a photovoltaic device by melting localised regions of the wafer and taking advantage of dilution of dopants, differing diffusion coefficients of dopants and impurities and variations in segregation coefficients of dopants and impurities.

Formation of junctions within the molten region using the variations in segregation coefficients.

Formation of junctions within the laser doped region using variations in diffusion coefficients of different dopant types.

Formation of junctions within the molten region using both the variations in diffusion and segregation coefficients of the various dopant types incorporated into the molten region.

Formation of localised molten regions for purification using the low segregation coefficients of impurities within the molten region.

Deliberate formation of localised molten regions with the deliberate addition of impurities to the melt with controlled cooling used in conjunction with the low metal segregation coefficient to facilitate formation of regions of low metal contamination and regions of high metal contamination e.g. nickel.

Making contact to buried layers.

Reduced impact from recombination sites formed from the laser induced formation of the molten/solidified regions through the use of deep and wide heavily doped molten regions.

These examples are explained in further detail below.

1) Formation of Junctions within the Molten Region Through the Use of Variations in the Segregation Coefficients When fabricating localised molten regions such as for forming heavily doped regions using laser doping, after the liquid state diffusion, the laser doped region goes through a process of liquid phase epitaxial growth, typically cooling from the centre of the wafer towards the wafer surface if the laser doped region is sufficiently deep. This process can provide a range of ways of controlling the distribution of different atom types by using their respective segregation coefficients. When melting a region containing 1 or more dopant atom types, if the silicon is molten for a sufficient length of time to allow adequate diffusion of dopants throughout the molten region, then provided the cooling process is sufficiently slow, the spatial concentrations of the dopants in the silicon after the liquid phase epitaxial growth process will be predominately determined by the segregation coefficients of the dopants. Depending on the dopant types added to the melt and their respective concentrations and segregation coefficients, this can allow for the formation of junctions and variations in dopant gradients during solidification. Furthermore, controlling the direction of re-solidification can allow different structures to be fabricated. For this process, to ensure the silicon resolidifies towards the surface of the wafer so that predominantly horizontal structures will be formed, it is preferable to form a molten region that is of greater width than it is deep. This ensures most heat will escape out of the bottom of the melt and ensure most growth is in the vertical direction. In comparison, if predominantly vertical junction structures (with horizontal dopant gradients) are required, increased horizontal cooling and solidification can be achieved by increasing the depth of the molten region relative to its width so that most of the heat during liquid phase epitaxial growth will escape from the sides of the molten region rather than through its bottom.

For example, using a p-type wafer with a bulk doping concentration of $1\times10^{16}$ cm$^{-3}$, a molten region could be formed containing both n-type and p-type dopants whereby the p-type dopant has a higher segregation coefficient than the n-type dopant as is the case when using boron and phosphorus with segregation coefficients of 0.8 and 0.35 respectively at 1400° C. If using appropriate concentrations of dopants in the source so as to give an average concentration of $1\times10^{17}$ cm$^{-3}$ for both boron and phosphorus within the melt and an appropriate heating/cooling regime, then a junction will be formed upon solidification within the region that was molten. In this case, by using a heating/cooling regime which results in the re-solidification front moving towards the surface of the wafer, then after the re-solidification process, the area of the laser doped region closest to the centre of the wafer which solidifies first will be p-type due to the higher segregation coefficient of boron than phosphorus and hence higher incorporation of boron in this region. At the surface of the wafer however, the surface will be n-type due to the lower segregation coefficient of phosphorus and hence larger accumulation of the n-type dopants within the molten region during the latter stages of solidification towards the surface, hence creating a p-n junction within the resolidified region. Such a process could therefore be used to create a localised emitter, or modify the location of the pre-existing junction.

On the other hand, for the same heating/cooling regime using a source whereby the p-type dopants have a lower segregation coefficient than the n-type dopants as is the case when using aluminium with a segregation coefficient of $2.8\times10^{-3}$, and phosphorus, then assuming the same doping concentration of $1\times10^{17}$ cm$^{-3}$ for both dopant types, the inverse structure can be formed. In this case, the area of the laser doped region closest to the centre of the wafer will be n-type, whilst at the surface of the wafer, the laser doped region will be p-type, due to the larger accumulation of the p-type dopants within the molten volume in the closing stages of solidification towards the surface of the wafer.

Such an approach could be used taking into account the pre-existing dopants in a solar cell structure, such as the dopants within the bulk wafer, emitter or dielectric layer. This approach could therefore be used to form a junction in a compensated wafer with both n-type and p-type dopants. For example, using a compensated p-type wafer with appropriate concentrations of boron and phosphorus, then by melting an appropriate volume of silicon and solidifying the molten silicon sufficiently slowly to allow the segregation process to occur, the region of the laser melted area which solidifies first will be p-type, whilst the surface region will be n-type due to the segregation coefficient of boron being higher than that of phosphorus. This effect would be enhanced by using dopants within the wafer with substantially different segregation coefficients such as by using phosphorus and gallium, however in this case gallium has a lower segregation coefficient than phosphorus, and thus the first region of silicon to solidify will be n-type whilst the surface region will be p-type. Furthermore, if using 3 or more dopant types in the molten region of appropriate concentrations and segregation coefficients, then multi-junction structures such as transistors can be formed within the resolidified regions. For example boron, phosphorus and aluminium dopants, could be used as boron has a higher segregation coefficient than phosphorus, which has a higher segregation coefficient than that of aluminium, hence allowing the formation of a p-n-p transistor within the resolidified region. Alternatively, multi-junction structures could be obtained by selecting the appropriate dopant type and concentration in the base, whereby one junction is formed at the interface between the silicon base and the region locally melted, whilst the other junction is formed within the molten region during solidification. Again, this could be achieved using compensated silicon, for example using a compensated n-type wafer with appropriate concentrations of boron and phosphorus. In this case following melting in a localised area, the first material to solidify will be p-type, therefore creating a junction whilst at the wafer surface, the last material to solidify will form an n-type region, hence creating an n-p-n transistor.

This structure could also be formed using a standard phosphorus doped n-type wafer whereby boron and phosphorus are incorporated into the molten region from one or more additional sources of appropriate concentrations. In this case, the additional source or sources of dopants could be an already formed diffused layer within the silicon, externally applied spin on dopant source, gaseous dopant source, liquid dopant source, dielectric layer applied dopant source or another means whereby the dopant sources are a mixture of multiple dopant types of the right respective concentrations. By reversing the direction of solidification, such that the molten region solidifies towards the centre of the wafer, inverted structures can be formed. Alternatively, for molten regions much deeper than their width, any of the above structures and junction types can be formed in the vertical direction (perpendicular to the wafer surface) rather than horizontally (parallel to the wafer surface)

2) Formation of Junctions within the Laser Doped Region Using Variations in Diffusion Coefficients of Different Dopant Types Similarly to the above, by using a sufficiently fast heating/cooling regime speed as to not allow a thorough mixing of dopants throughout the molten region, the diffusion coefficients of the dopants will determine the spatial concentrations of each dopant type.

If using both n-type and p-type dopants whereby the n-type dopant has a higher diffusion coefficient than that of the p-type dopant as is the case when using boron (D=$1.2\times10^{-8}$ m$^2$/s) and phosphorus (D=$5.8\times10^{-8}$ m$^2$/s), then assuming a sufficiently high boron dopant concentration to overcome the remaining n-type dopants at the surface, the surface of the laser doped region will be p-type, whilst further into the molten region, the laser doped region will be n-type. Hence, it is possible that by using the same laser dopant source of boron and phosphorus which results in an n-type layer at the surface and underlying p-type layer when using a slow heating/cooling regime such that the segregation coefficients determine the distribution of the dopants, by increasing the rate of heating/cooling regime such that the diffusion coefficients determine the distribution of the dopants, then the inverted structure with a p-type surface layer and underlying n-type layer can be formed.

By incorporating n-type and p-type dopants into the melt where the p-type dopants have a higher diffusion coefficient than the n-type dopants such as the case when using aluminium (D=$6.8\times10^{-8}$ m$^2$/s), and phosphorus, the inverted structure can be formed, therefore forming an n-type layer at the surface and underlying p-type layer.

Figure 2:
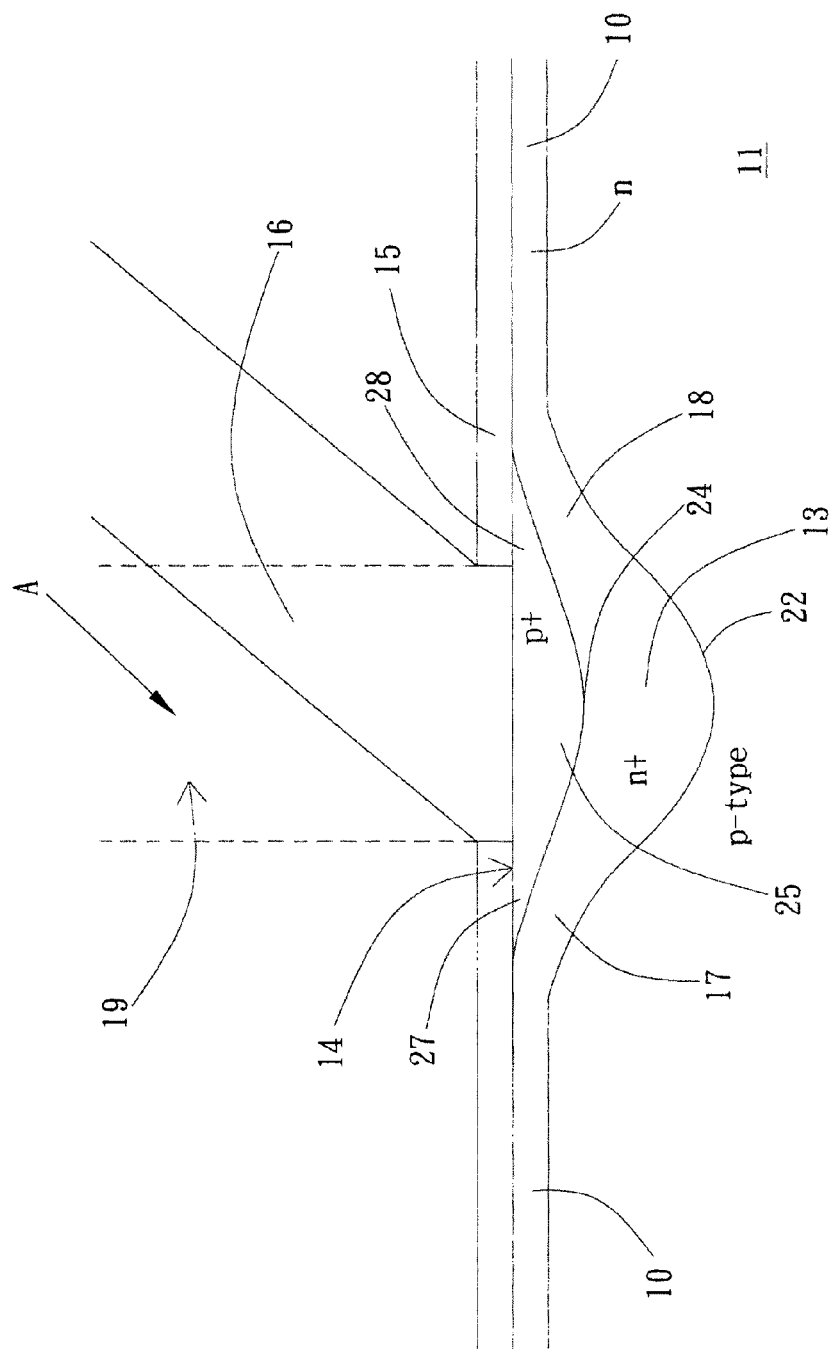
FIG. 2 diagrammatically illustrates a cross section of a laser doped line where a p-n-p transistor structure is formed within a melt region.

This of course can be extended to the use of base dopants to form multi-junction structures within the solar cell such as a p-n-p transistor formed for example on a p-type wafer with an n-type phosphorus emitter whereby additional boron dopants are incorporated to the wafer during the molten phase, such that the phosphorus emitter is pushed ahead of the p-type dopants as is shown in FIG. 2. FIG. 2 diagrammatically illustrates an example of a surface region of a silicon wafer 11 having a surface emitter and where a p-n-p junction structure comprising junctions 22 and 24 has been formed under a doped line comprising an n-type doped region 13 connected to the surface emitter 10 and a p-type doped region 25 overlying the n-type region 13 to form a p-n-p transistor structure. Again a laser is used with beam diameter of about 20 microns scanned over the surface 14 in the direction into the page. A much shallower melt of the n type material 17, 18 and of the p-type material 27, 28 is formed to the right and left of the illuminated area, by heat conducting laterally through the silicon to form an extended melt region on the silicon surface underneath the SiN antireflection layer 15 on either side of the opening 16 in the SiN layer.

Conversely, an n-p-n transistor structure could be formed using an n-type wafer and applying a dopant source containing phosphorus and aluminium. Alternatively, three or more dopant types using appropriate concentrations and diffusion coefficients could be incorporated into the molten region to create multi-junction structures during solidification within the material that was molten. This creates the possibility therefore to also form thyristor structures in localised areas with the extra junction being formed by using a wafer of opposite polarity to that of the first material to solidify during liquid phase epitaxial growth.

3) Formation of Junctions within the Molten Region Using Both the Variations in Diffusion and Segregation Coefficients of the Various Dopant Types Incorporated into the Molten Region A variation of the above is to have junctions and doping gradients within the solidified material from the molten region formed by deliberately capitalising on variations in both the diffusion and segregation coefficients to engineer the desired structure and spatial distribution of the dopants. For example, if using a p-type wafer to which a dopant source containing appropriate concentrations of phosphorus and boron is applied with an appropriate heating/cooling regime for the region being made molten, an n-p-n transistor can be formed within the material as it solidifies, hence creating a p-n-p-n thyristor structure. For this structure to be formed it is required that the heating/cooling regime is sufficiently quick to allow the diffusion of phosphorus ahead of boron within the molten region and the re-solidification of this region dominated by the phosphorus before the boron has sufficient time to diffuse to these extremities of the molten region in sufficient concentrations to overcome the concentration of phosphorus. Hence the silicon will be n-type in such regions. However as the silicon continues to cool towards the surface, there is more time for both the phosphorus and boron dopants to mix in the remaining molten region, and allow the final distribution of the dopants to be determined by the segregation coefficients of the dopants. As a result, a subsequently resolidifying region could become p-type due to the higher segregation coefficient of boron than phosphorus, whilst the surface becomes n-type due to lower segregation coefficient of phosphorus that allows its accumulation to much higher concentrations in the last of the molten material to solidify near the wafer surface.

4) Formation of Localised Molten Regions for Purification Using the Low Segregation Coefficients of Impurities within the Molten Region Particularly for the case of low quality silicon with high impurity concentrations, using a liquid phase epitaxial growth process could assist with improving material quality in the vicinity of the device junction by minimising impurity concentrations in this region. When involving impurities with segregation coefficients of less than 1, higher concentrations of the impurities will result in the regions last to solidify, hence when a region solidifies towards the surface of the semiconductor device, higher concentrations of the impurities will be at the surface.

For example, using a p-type UMG silicon wafer with a uniform concentration of iron throughout the wafer of $1 \times 10^{15}$ $cm^{-3}$, boron doping concentration of $1 \times 10^{16}$ $cm^{-3}$ and a phosphorus emitter applied on the surface, the concentration of iron in the vicinity of the junction can be greatly reduced by forming or reforming the junction from the molten phase. The segregation coefficient of iron is approximately $6.4 \times 10^{-6}$ and hence, assuming the junction of the device forms at the interface between the solid and resolidified silicon, then the concentration of iron at the interface in the n-type silicon will be approximately $6.4 \times 10^{9}$ $cm^{-3}$. However this would still result in a concentration of iron on the p-type side of the junction of approximately $1 \times 10^{15}$ $cm^{-3}$. For the case of other impurities such as nickel with a segregation coefficient of $3.2 \times 10^{-5}$ or copper with a segregation coefficient of $8 \times 10^{-4}$ the concentration of the impurities on the p-type side of the junction will be approximately $3.2 \times 10^{10}$ $cm^{-3}$ and $8 \times 10^{11}$ $cm^{-3}$ respectively.

However if the melting and re-solidification in this region is done sufficiently quickly as to not allow the diffusion of sufficient phosphorus to the extremities of the molten region and hence the region to solidify remains p-type, then providing the rate of solidification is slow enough to allow segregation of the iron during the recrystallization process, the concentration of iron on both sides of the junction in the vicinity of the junction is greatly reduced. This could further be assisted by the addition of p-type dopants into the molten region preferably with a higher diffusion coefficient than phosphorus to move the p-n junction further from the interface of the solid and resolidified silicon through the use of diffusion and/or segregation coefficients such that the impurity concentration of iron on both sides of the junction is reduced.

However when molten regions are formed by laser doping using conventional nanosecond pulse length Q-switch lasers, the junction depth is typically shallow and less than 2 microns in depth. This results in a rapid solidification of the silicon towards the surface such that the impurities cannot segregate towards the surface and hence remain in close vicinity of the junction which may lead to enhanced recombination, particularly around the edge regions where the junction is even closer to the surface.

Therefore, by extending the time for which the silicon remains molten, the volume of molten silicon can be greatly increased in both the lateral and vertical direction, resulting in a more hemispherical molten region. By increasing the volume of the molten region, the silicon can solidify towards the surface of the silicon at the centre of the laser doped region, during the solidification process, therefore reducing the impurity concentrations in the vicinity of the junction at the edge of the laser doped region and increasing the distance between the junction of the device and the surface of the semiconductor material where high concentrations of the impurities are present. The preferred approach for doing so is using a CW or very high frequency Q-switched or pulsed (>5 MHz) laser such that the silicon does not resolidify between successive pulses, resulting in a junction depth of more than 4 microns. Alternatively, extending the pulse length or modifying the pulse shape to allow the silicon to remain molten for a sufficient amount of time can be used. For all laser sources the silicon should remain molten for a period of at least 1 microsecond and preferably for a period of at least 2 microseconds. In some embodiments the silicon may remain molten for as long as 100 microseconds and possibly more than 1 second.

5) Deliberate Formation of Localised Molten Regions with the Deliberate Addition of Impurities to the Melt with Controlled Cooling Used in Conjunction with the Low Metal Segregation Coefficient to Facilitate Formation of Regions of Low Metal Contamination and Regions of High Metal Contamination e.g. Nickel Using the segregation coefficients of impurities during the liquid phase epitaxial growth process in the cooling phase of laser doping, one can allow for the intentional addition of impurities such as nickel, copper or iron to either the wafer growth process, or subsequent processes such as during laser doping, with beneficial results.

For example, the addition of a nickel containing material into an applied dopant source can assist in the formation of the nickel contact for laser doped solar cells. Due to the low segregation coefficient, with a sufficiently slow rate of solidification to allow segregation to occur, little nickel will remain in the first part of the silicon to solidify and this can be engineered to be in the region close to the device junction thereby avoiding junction recombination and shunting. Furthermore, higher concentrations of nickel may be engineered to be present closer to the surface. The presence of such nickel, when incorporated in the right form of nickel silicide (NiSi), acts as a diffusion barrier that prevents the diffusion of copper through the NiSi layer and into the silicon material. Following the solidification of the molten silicon during the laser doping process, the nickel concentrations throughout the solidified material are primarily determined by the segregation coefficient of nickel, meaning that it is not in the right form to act as a diffusion barrier. A subsequent thermal treatment such as in the temperature range of 300-450° C. and preferably within the range of 330-400° C., allows the nickel to redistribute itself to form NiSi in all the regions where there is a higher density of nickel atoms than silicon atoms. Such regions are primarily where the silicon last solidifies from the laser doping process which is predominantly near the wafer surface where the nickel silicides can then be used to both act as a diffusion barrier to copper and to nucleate copper plating such as through either an electroless copper deposition, light induced copper plating process or even electroplating of copper. Metals other than copper can also be used such as silver and tin and other metal deposition techniques other than plating can also be used such as sputtering, E-beam evaporation, screen-printing, jet printing etc.

For this process, whereby nickel is intentionally added to a dopant source, the diffusion coefficient of nickel is less than that of dopants typically used for solar cells such as boron and phosphorus. Therefore, by melting a large volume of silicon (i.e. of more than 4 microns depth from the surface) and allowing the dopants to diffuse ahead of the nickel, and the extremities of the laser doped region to resolidify before the nickel can reach such areas, the concentration of nickel in close proximity of the junction can be minimised. In addition, if during the liquid phase epitaxial growth process the molten silicon region, particularly in the latter stages of recrystallization, is cooled sufficiently slowly to allow sufficient diffusion of the nickel atoms throughout the remainder of the molten silicon region, the nickel will be more concentrated at the surface of the silicon due to the low segregation coefficient of nickel. Alternatively, laser doping could be performed in a two stage process, where the molten region extends deeper in the first stage than in the second. In the first stage dopants are incorporated into the molten region to form the device junction and in the second stage impurities such as nickel are added, hence ensuring the impurities do not reach the device junction formed during the first stage. This could be achieved without optical alignment whereby a system is integrated to incorporate dopant application and laser doping such that the vacuum suction holding the wafer in place is not broken between the first and second stage laser melting or doping steps.

On the other hand, by reversing the direction of solidification, impurities such as nickel, copper or iron can be intentionally concentrated at the device junction, therefore leading to increased junction recombination which could be used as a mechanism to deliberately shunt or short out the particular junction. Alternatively, by allowing sufficient mixing of such impurities throughout the molten region and rapidly removing the laser illumination to prevent the segregation of the impurities, an increased impurity concentration may also result in certain areas.

6) Making Contact to Buried Layers

Figure 3:
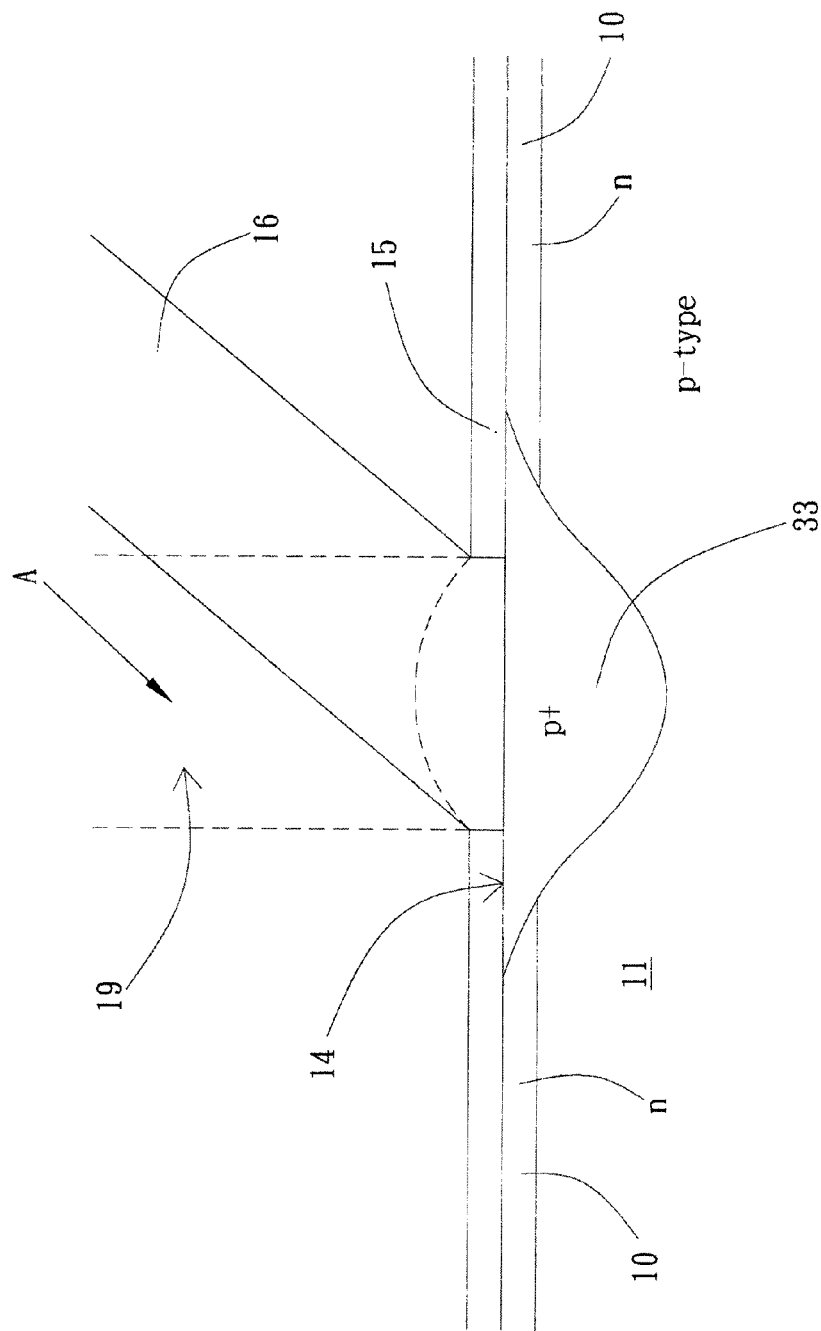
FIG. 3 diagrammatically illustrates a cross section of p-type laser doped line penetrating an n-type emitter to contact the underlying p-type silicon base.

By varying the concentrations of dopants within a molten region as well as varying the heating/cooling regime, the concentration of dopants in an existing layer such as an emitter at the surface of a semiconductor device can be overcome to allow direct contact to a buried layer. In this example, using the same applied dopant source which results in the formation of a p-n-p transistor as described earlier (with reference to FIG. 2) when capitalising on the different diffusion coefficients (i.e. using a source of boron as the additional p-type dopant source), in this case by allowing the adequate mixing of dopants within the molten region, the dopants from the n-type emitter can be smeared out and their concentration substantially reduced. At the same time, the added p-type dopants can be incorporated to higher levels than that of the n-type dopants and hence the molten region 33 becomes p-type, allowing direct contact to the p-type base 11 as shown in FIG. 3. Using the preferred method of laser doping with a CW laser, this approach can be used to make electrical contact from the wafer surface, to buried layers as deep as 20 microns from the surface.

These contacts may penetrate through an active junction for the case of interdigitated contacts or an emitter acting as a floating junction. Particularly for the case of devices fabricated on p-type substrates with an n-type emitter, this aspect can allow for a single thermal diffusion to be applied to both surfaces of the semiconductor device which gives the required lateral conductance of the active emitter layer. The sheet resistance on both surfaces may be either the same or different depending on the method used for the diffusion and/or subsequent chemical processes applied. This allows both surfaces of p-type solar cell to be n-type which is advantageous for surface passivation in terms of reducing recombination, and can use industry standard Plasma Enhanced Chemical Vapour Deposition (PECVD) layers such as SiN. Varying process conditions during the diffusion and subsequent chemical processes can allow more lightly-doped floating junctions to be formed on one surface which minimise the associated dark saturation current density, whilst retaining a sufficiently heavily doped emitter on the other surface for the active junction of the device to minimise emitter resistive losses.

It is near impossible to form a good quality junction when the doping concentrations are too high on both sides of the junction. This is well documented in the literature with processes such as trap assisted tunneling, which typically occurs when dopants on both sides of the junction are in concentrations above $10^{18}/cm^3$, preventing the junction from achieving good rectifying properties. Thus it is usually impossible to form a good quality junction by overdoping an already heavily doped region (i.e. above $10^{18}/cm^3$) because the doping on both sides of the junction is too high. When forming deep heavily doped regions using laser doping through a layer of opposite polarity, whilst the semiconductor region is molten, impurities from the molten region diffuse into the surrounding material via solid state diffusion. Similarly, impurities from the most heavily doped surrounding solid semiconductor material can diffuse either into or away from the molten semiconductor material in a way that such smearing of the dopants in such close proximity to the junction helps reduce the doping concentration in the most critical region to below the threshold to induce diode tunneling and therefore allowing good diode properties to be achieved. To avoid diode tunneling, it is also desirable to perform a drive in step for the emitter and/or slight etch back of the surface to reduce the surface dopant concentration of the emitter, to further assist with the spreading of dopants during the solid state diffusion process to below the diode tunneling threshold. Lateral segregation will improve the quality of the junction formed between the laser doped contact and surrounding surface layer of opposite polarity and reduce shunting. Because of this effect, dopants could be chosen with reduced segregation coefficients which enhances the ability of reducing the dopant concentration on one side of the junction such as using gallium or aluminium instead of boron.

In addition, dopants from the molten region diffuse into the surrounding solid regions, therefore slightly shifting the location of the junction away from the molten region where the dopant concentration is lower. This improvement though is not possible with conventional Q-switched lasers as the silicon is not kept molten for long enough to allow sufficient solid state diffusion to occur in the regions immediately adjacent to where the silicon is made molten. In addition, it is only effective in conjunction with deep junctions or laser melted regions at least several microns thick since the molten volume needs to be sufficiently large so that dopants diffusing into the region from the existing surface layer of the wafer can be adequately diluted within the molten volume to reduce the doping concentration to suitable levels.

Due to the substantial spreading of dopants in the deep molten regions, such contacts can be formed through emitters with sheet resistances of <50 ohms/sq while avoiding shunting, trap-assisted tunneling or junction breakdown. These contacts could be formed through emitters of more than 10 microns in depth if such emitters could be formed.

During cool down the very first region of the surface of the molten region to resolidify will be at the edge of the molten region immediately next to the surrounding surface layer which creates a vertical p-n junction. As a result, the liquid phase epitaxial growth process at the surface occurs laterally towards the centre of the molten region. Subsequently, due to segregation, both dopant concentrations on the molten side of the p-n junction will be reduced to lower values than the average within the melt. This further dilutes the concentration of dopants in the vicinity of the junction which are of the same polarity as the surrounding surface layer in addition to the dilution of the dopants of the same type as the surrounding emitter by smearing out the dopants throughout the deep molten region.

Forming interdigitated contacts in this manner, allows almost full emitter coverage to be achieved on the rear of the cell and hence enables increased carrier collection. This can therefore relax the constraints placed on wafer quality in contrast to the tight constraints for wafers required by most rear contact cell designs which only have partial emitter coverage. An example processing sequence for this structure is given in Example 2.

In one approach a laser beam with a Gaussian beam spatial power profile may be used where the dielectric layer requires a higher temperature for removal than the temperature at which the silicon becomes molten. It is also preferred that the silicon have a higher thermal conductivity and diffusivity than the dielectric layer such that the molten silicon extends beyond the opening in the dielectric layer. In another approach, a laser beam with a top hat spatial power profile in the direction perpendicular to the direction of scanning may be used, relying on the higher thermal conductivity and diffusivity of the silicon than the dielectric layer to extend the molten region beyond the opening in the dielectric layer. In this approach it is preferred to use a Gaussian beam spatial power profile in the direction of travel to preheat the laser doped region and reduce thermal defects. Both of these methods allow a wide lateral diffusion of dopants that can help ensure the metal contact does not contact with un-doped silicon, or silicon of the opposite polarity to that of the desired contact.

As an extension to contacting buried layers in devices, this approach can be used to join semiconductor regions. If using two or more parallel layers of the same polarity spaced less than 20 microns from a given surface of the semiconductor device, forming deep heavily doped regions on the given surface of the semiconductor device could allow such layers to be connected. Doing so will allow for further enhancements of quantum efficiency ensuring more carriers are collected. Furthermore, for devices less than 40 microns thick, by laser doping on one or more surfaces, surface layers on both sides of the device may be connected.

For thin film solar cells, a major limiting factor for the performance is the low quality of the semiconductor materials. This results in a short diffusion length, hence the active layers for such solar cells are typically in the order of 1-10 microns, as using thicker layers allows little extra current to be collected. However by forming such solar cells with alternate stacks of n-type and p-type semiconductor materials at predetermined intervals, carriers generated throughout the solar cell only have to travel small distances to be collected by a junction in comparison to that required if using a single junction device of the same total thickness. As a result, the quantum efficiency and hence current of such devices can be greatly enhanced. An example processing sequence of a cell structure which would use this method of joining two layers is given in Example 3.

7) Reduced Impact from Recombination Sites Formed from the Laser Induced Formation of the Molten/Solidified Regions Through the Use of Deep and Wide Heavily Doped Molten Regions.

Some of the above processes introduce recombination within or in the vicinity of the laser melted region, such as by creating a metal/silicon interface, introducing metal atoms that can create recombination sites for minority carriers or by creating laser damage such as due to the thermal expansion mismatch between the silicon and the overlying dielectric layer that remains solid adjacent to the location where the heat (laser beam) is applied. A very effective way of minimising the negative impact of such recombination sites is to ensure that the recombination locations are contained within heavily doped regions of silicon that minimise the minority carrier concentrations in the vicinity of the recombination sites. Equivalently, this can be achieved by ensuring the molten regions are both heavily doped and extend far enough in each direction to encompass all such recombination sites.

Forming deep and wide molten regions by keeping the silicon molten for a sufficiently long time can therefore assist in protecting against recombination by ensuring that virtually any defects induced during the laser doping process are encompassed by a heavily doped region, therefore increasing durability. As a result, metallic contacts can extend over the defected region without showing substantial performance degradation to the finished device.

There have been several reports indicating that various defects are formed within about 5 microns of the location where the laser beam is incident on the silicon during conventional laser doping. For conventional laser doping methods, when placing metal contacts over a laser doped region, care must be taken such that the metal is not in contact with defected regions along the edge of the laser doped lines. As the defects often lie outside the heavily doped region, this could allow the metal contact to be in direct contact with the bulk semiconductor material leading to enhanced recombination and potentially shunting.

Various techniques have been reported for the avoidance of such laser induced defects during the laser doping process such as: by avoiding the thermal cycling by using CW lasers to continuously apply heat to the semiconductor device and by pre-heating the surrounding areas prior to the high energy density beam passing. In other approaches, to avoid the thermal expansion mismatch between silicon and dielectric layers which have larger thermal expansion coefficients than the silicon (such as SiN), extra dielectric layers such as SiO2 have been placed in between the silicon and the capping dielectric layer due to the lower thermal expansion coefficient of SiO2 than silicon.

However, the method proposed here relies on the formation of a deep and wide molten silicon region to encompass virtually all such defects while simultaneously making it possible to heavily dope such regions for additional protection in the event that the overlying surface passivating layer has also been damaged. Such damaged regions are typically within a distance of about 5 microns from the edge of the incident laser beam used for melting and doping the silicon and therefore easily engulfed by the proposed techniques by designing the processes to achieve an adequate depth of the melted silicon region. In this method, when metal contacts are placed over the heavily doped region, performance degradation caused by laser induced defects may be reduced as virtually all residual defects formed during the laser doping process lie within the heavily doped region. This approach may therefore remove the need to use extra dielectric layers to correct for thermal mismatch between the silicon and dielectric layers such as SiN which have a higher thermal expansion coefficient than silicon. The deep lateral diffusion underneath the dielectric layer can be best seen in FIG. 1.

Additional solid state diffusion of the dopants from the edge of the deep molten region or the adjacent dielectric/dopant source into the solid silicon just beyond the molten region, particularly at the silicon surface, can also assist in encompassing or minimising the impact of defects, potentially reducing the need for such deep molten regions.

When using a dielectric layer which can act as a dopant source such as $Al_xO_y$ or doped a-Si or doped SiN, solid state diffusion in the regions adjacent to the laser melted region near the semiconductor surface can be enhanced. Besides simplifying the laser doping process by not requiring the addition of extra layers to intentionally introduce dopants into the semiconductor material, the use of dielectric layers which contain a dopant source can then also enhance solid state diffusion to assist with the healing of laser induced defects adjacent to the molten region to ensure such defects are encompassed by a heavily doped region and therefore do not contribute significantly to the total dark saturation current density of the device.

Figure 4:
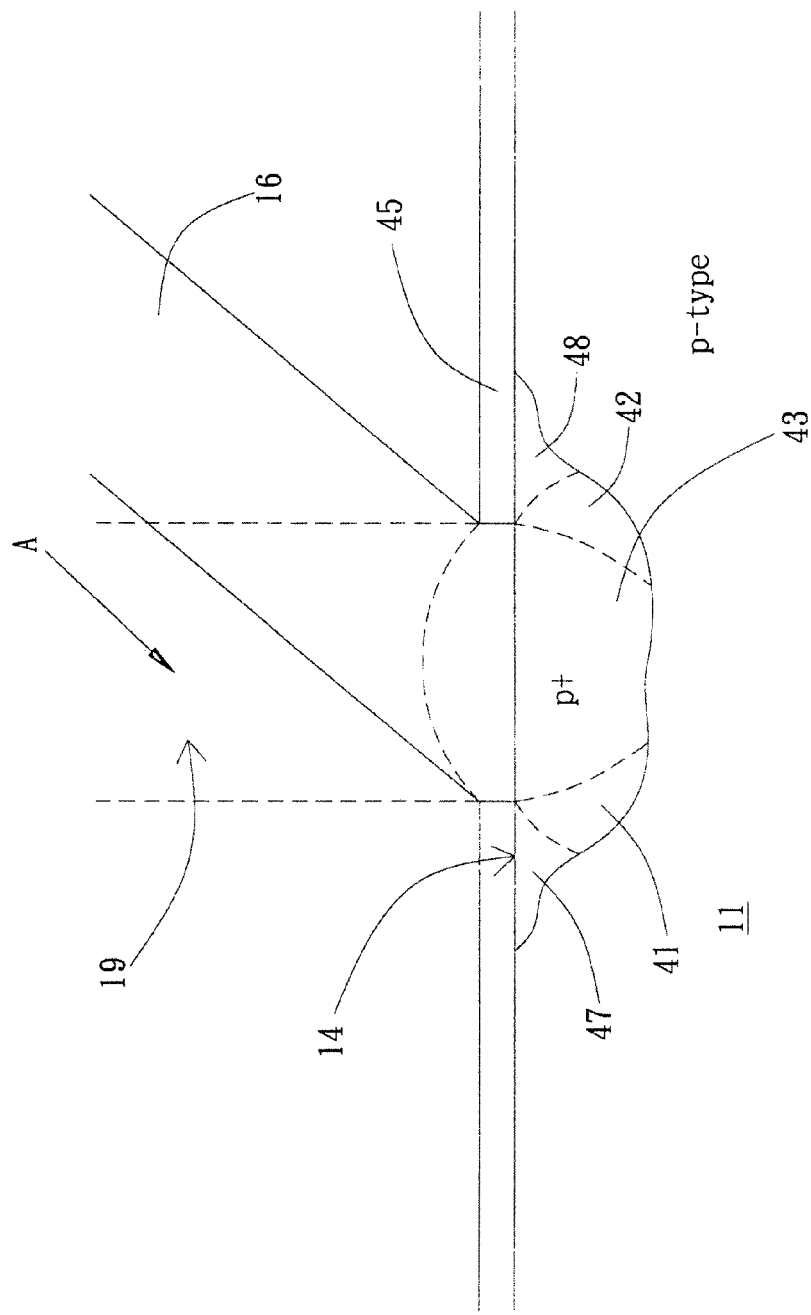
FIG. 4 diagrammatically illustrates a cross section of a p-type laser doped line (using aluminium in an AlxOy dielectric layer as a dopant source) in which heating of the dielectric layer around an opened region during laser doping facilitates solid state diffusion of aluminium into the silicon surrounding the melted region.

For example, referring to FIG. 4, when using $Al_xO_y$ as a dielectric layer 45 over a p-type substrate 11, if using an appropriate laser 19 which can form a deep heavily doped p+ region 43, aluminium from the $Al_xO_y$ layer can be incorporated into the semiconductor material and become electrically active. The regions of the semiconductor which become molten undergo liquid state diffusion to form the deep heavily doped region 43. As with the FIG. 1 example, a much shallower melt 41, 42 may be formed to the right and left of the illuminated area, by heat conducting laterally through the silicon to form an extended melt region on the silicon surface underneath the SiN antireflection layer 45. Additionally in the adjacent regions which do not melt, heating from the laser can result in the $Al_xO_y$ acting as a dopant source for solid state diffusion from the dielectric layer into the silicon regions 47 & 48 underlying the $Al_xO_y$ layer, resulting in the diffusion of aluminium several microns into the semiconductor device to the sides of the shallower regions 41, 42 surrounding the deep heavily doped region 43. In addition to the solid state diffusion which occurs at the interface of the liquid and solid semiconductor material, the solid state diffusion from the dielectric layer will extend the heavily doped layer further beyond the defected region.

The inability to control doping types and doping concentrations more than a few microns from the wafer surface is an important limitation for many reasons such as when forming a heavily doped junction beneath a metal contact formed on the surface of the semiconductor. It is desirable to have such junctions as deep as possible to minimise the dark saturation current contribution from the metal/silicon interface and also to improve the durability of the device during subsequent thermal processes or during operation in the field where the greater distance from the metal to the junction makes it more difficult for the metal to penetrate to the junction and damage the device. In fact with significantly deeper junctions beneath the metal contact than currently used in all commercial silicon solar cells, it becomes feasible to not only achieve improved durability, but also facilitate the use of alternative metals such as copper to contact the silicon. Such metals have not normally been used in the past due to the penetration of the metal into the silicon and junction region after operation in the field over many years. This may also be used in conjunction with an aligned screen print process to the laser doped region on a screen printed solar cell with an aluminium Back Surface Field (BSF) and front silver contacts. Provided the laser doping region extends beyond the width of the screen printed contact, the junction should be sufficiently deep that the silver will not shunt the junction during firing, and thus the contacts may be co-fired at a temperature to optimise other aspects of the device such as the formation of the aluminium BSF, rather than sacrificing the formation of the BSF by firing at a lower temperature to ensure the silver contacts do not penetrate the junction and shunt the device as is typically done for conventional screen printed solar cells.

Typically it is very hard to achieve low sheet resistances due to the limitations imposed by the solid solubilities of dopants in silicon and the difficulty of achieving high doping concentrations more than a micron or so from the silicon surface using conventional approaches for thermal diffusions, laser doping and/or ion implantation. This is particularly the case with p-type diffusions due to the lower diffusion coefficients of p-type dopants (such as boron) compared to n-type dopants (such as phosphorus). To achieve low sheet resistances, lengthy high temperature processes are required. For the preferred method of laser melting, as the diffusion is performed in liquid state, the dopants are subject to much higher diffusion coefficients than in the solid state and therefore much lower sheet resistances are obtainable than for conventional solid-state diffusions. However with laser doping using conventional nanosecond pulse length Q-switched lasers, the resultant dopant depth is normally less than 2 microns and the dopants are not given sufficient time to mix. As a result, particularly for p-type dopants it is still difficult to obtain low sheet resistances.

However by choosing appropriate laser parameters such as using a CW laser and appropriate scanning speed, the silicon can be melted to the desired depth, facilitating doping of the molten region from a surface dopant source or even a dopant source already formed within the surface region of the silicon where dopants can be incorporated above their solid solubilities by other thermal processes. As a result, using the same laser specifications which allow a wide and deep molten region to be formed to protect against recombination, a low sheet resistance can be obtained within the heavily doped region.

The desired sheet resistivity can be achieved through control of the various processing parameters including the depth of the molten region, the length the region remains molten that facilitates dopant diffusion in the molten state and the nature of the dopant source which affects the number of dopants able to penetrate into the molten silicon. Such dopant sources can be solid, liquid or gas and of varying concentration and can be applied prior to or during the heating of the silicon. Melted regions can also form virtually any desired geometry as well as depth, such as the formation of thin conducting lines to carry electronic charge from one region of the device to another, or even to interconnect adjacent devices.

The deeper molten regions in conjunction with appropriate dopant sources and adequate mixing of dopants can yield substantially lower sheet resistances than obtainable using conventional laser doping processes or solid state diffusions, with sheet resistances <1 ohm/sq achievable for both n-type and p-type dopants. This can be achieved, even with resulting average dopant concentrations substantially below the solid solubility of the dopant throughout the heavily doped region.

By melting the silicon using either a CW laser or an alternative heat source such as a very high frequency pulsed laser, with a frequency above 5 MHz and preferably above 10 MHz, whereby the silicon does not resolidify in between successive pulses, there is no need to use several melting and solidification cycles of the silicon to achieve sufficient mixing of the dopants to form a heavily doped region.

The use of pulsed lasers which result in the silicon resolidifying between successive pulses limits the depth of the molten region and also the distance that the dopants can diffuse. By using a higher power or higher frequency laser which still results in the silicon resolidifying between successive pulses, the diffused region will still be shallow as the increasing power density will likely cause the silicon to ablate rather than achieve sufficiently deeper melting. This thermal cycling also tends to enhance the formation of crystallographic defects which are detrimental to device performance.

However, when using pulsed lasers with frequencies <5; MHz, with appropriate modification, deeper junction depths can be obtained. This can be achieved by extending the pulse lengths, preferably such that the silicon will remain molten for a period greater than 1 microsecond and preferably greater than 2 microseconds. In some embodiments the silicon may remain molten for as long as 100 microseconds and possibly more than 1 second. It is also preferable, when multiple pulses are required for a given area, that the silicon does not have time to solidify between successive pulses. The temporal pulse power profile may also be tailored to have a longer tail to minimise the ablation of the silicon and extend the time during which the silicon remains molten, particularly for the case of 1064 nm lasers due to the increased absorption of energy at this wavelength in the molten phase. Therefore with the sufficient extension of the pulse length, it would be possible for the silicon to remain molten for sufficient time to create a deeper and wider molten region using a single pulse than with conventional pulsed lasers using multiple pulses. Furthermore, a pulse may be shaped to have high power initially to melt the silicon, and decay rapidly to a lower value to maintain the silicon in the molten state and extend the molten region without ablating the silicon, after which the illumination is removed and the silicon resolidifies.

Another benefit of controlling the laser doping parameters such that a deep and wide molten region is formed is to decrease spreading resistance when the heavily doped region is of the same polarity as the bulk material. This aspect is particularly important for cell technologies incorporating rear surface contacts with a low coverage area such as those using point contacts. To overcome spreading resistance, PERL solar cells use several lengthy and high temperature diffusion steps and photolithographic processing to increase the collection area whilst minimising the metal/silicon interface area.

The method of increased collection areas has also been employed for the rear side of double-sided buried contact solar cells, however the increase collection areas created by the laser doped grooves requires modification of the wafer surface and also increases the metal/silicon interface area and hence the cells suffer from larger dark saturation current densities than would occur if the surface of the heavily doped region was co-planar with that of the surrounding bulk material.

A substantial reduction in spreading resistance may be achieved if molten regions are formed such that the lateral doping extends more than 5 microns from the opening in the dielectric layer and the depth is more than 5 microns. This process allows for increased collection areas without substantially increasing the metal silicon interface area.

Further to this, the careful control of the heat delivered to the silicon surface also allows the silicon to be held in a molten state for a prolonged period following the desired depth of the melt being reached. This allows additional solid state diffusion to take place in surrounding regions such as when dopants diffuse into the surrounding solid silicon from either the molten silicon or the surface dielectric layer/dopant source. This can be important for further reducing the spreading resistance by increasing the collection area or for reducing the negative impact in some situations of having doping gradients near the edge of the melt that are too large.

Figure 5:
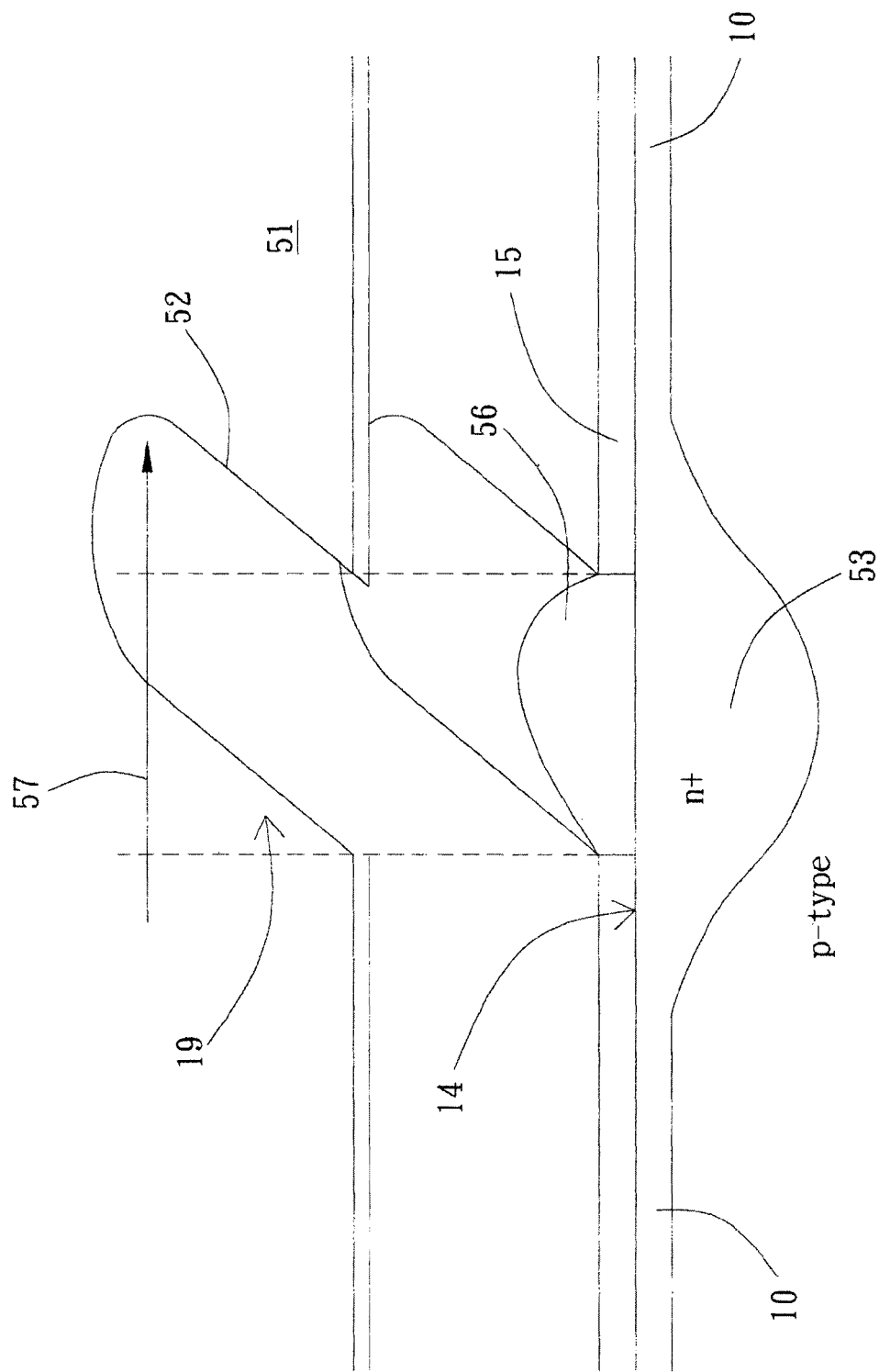
FIG. 5 diagrammatically illustrates a cross section of a laser doped point contact.

Referring to FIG. 5, point contacts (and other non-1D structures) can be used as a means to reduce recombination and spreading resistance. Such point contacts (and other non-1D structures) can be fabricated using a CW laser source either by using a physical mask such as a screen 51 having shaped apertures, such as the slot 52, through which the laser 19 can only reach the surface 14 of the semiconductor (or the Anti-Reflection Coating (ARC) 15 over the surface) for part of the time as it periodically scans across the aperture 52 in the screen 51, or by using optics to only intermittently allow the laser beam to reach the wafer surface. The former is the preferred approach as it means that, if the laser is operated in a scanning fashion, regions at the start and end of the region exposed to the laser beam, as it progressively scans across different parts of the slotted aperture 52, will be directly exposed to the laser beam for the same time as regions exposed through the middle of the aperture. This can be done using the screen 51 with openings 52 positioned over a wafer 11 and using an appropriate scanning speed and laser power to ensure adequate mixing of dopants of all areas along the direction of the laser sweep 57, and ensure a deep melted region 53 and a corresponding deep junction formation throughout the point contact to heal damage caused by laser induced defects with the junction 53 extending beyond the opening in the dielectric layer 56. For point contacts, the laser is typically scanned perpendicular to the openings 52 in the screen 51. A cross-section of a point contact and the corresponding screen 51 is shown in FIG. 5.

A pulsed laser may also be operated in a fashion using long individual pulses with each pulse having the power versus time profile needed to achieve the deep molten regions as previously described. In this scenario, one long pulse is used for each point contact, with the laser moving to a new location between pulses. Another laser based approach is to use a shutter which controls when the laser is applied to the wafer surface. In this case the laser may be held stationary over a location for a period of time, whereby the shutter is then opened for a desired period of time, before the laser shutter is closed and the sample and/or laser beam is moved to the location of the next contact. Importantly, with this approach the shutter or associated components such as a beam dump absorbs part or all of the energy from the laser when it is closed. The opening and closing of the shutter importantly provides the ramping up and ramping down of the laser power to the illuminated spot, as necessary to achieve the desired deep molten regions without ablation of the silicon or excessive defect generation during cooling. The contacts may also be formed by a continuous scan over the sample where the shutter is opened for a predetermined length of time during the sweep.

Other optical approaches may be used to switch the location of the laser beam over various regions of the wafer in predetermined intervals and with provision for appropriate ramping of the laser power as required.

When deep localised heavily doped regions form the junction of the device or part of a device junction whereby an additional process such as a thermal diffusion provides a diffused layer over part of or the entire semiconductor surface, the collection area of the device junction can be enhanced. Due to the depth of the diffusion, particularly for the case whereby the heavily doped region formed using this method forms the entire active junction of the device, current crowding can be reduced in a similar manner to minimising spreading resistance when the heavily doped region is of the same polarity as the base semiconductor material.

The quantum efficiency of the device can also be improved by bringing the junction closer to other regions of the device. If using such heavily doped regions on the light receiving surface of the device, enhancements to the long wavelength response of the device can be obtained by having parts of the junction closer to the non-light receiving surface. Similarly, if forming the heavily doped regions on the non-light receiving surface of the device, enhancements to the short wavelength of the device can result by bringing the junction in localised regions closer to the light receiving surface of the device.

The quantum efficiency of solar cells could also be improved by allowing the formation of deep heavily doped regions, and the dopants to be distributed according to the segregation coefficients and hence creating a doping concentration gradient which can effectively repel minority carriers.

EXAMPLE PROCESSING SEQUENCES

There are many structures which could be fabricated using the methods described herein. Four example solar cell structures have been detailed below which incorporate some of these methods. Note that many combinations of these methods are possible. The four examples include:
1. Laser doped selective emitter solar cell.
2. Interdigitated back contact solar cell.
3. Emitter Wrap Through solar cell.
4. Double sided laser doped selective emitter solar cell with aluminium oxide rear surface passivation.

Example 1

Fabrication of Laser Doped Solar Cell Using CW Laser

Figure 6:
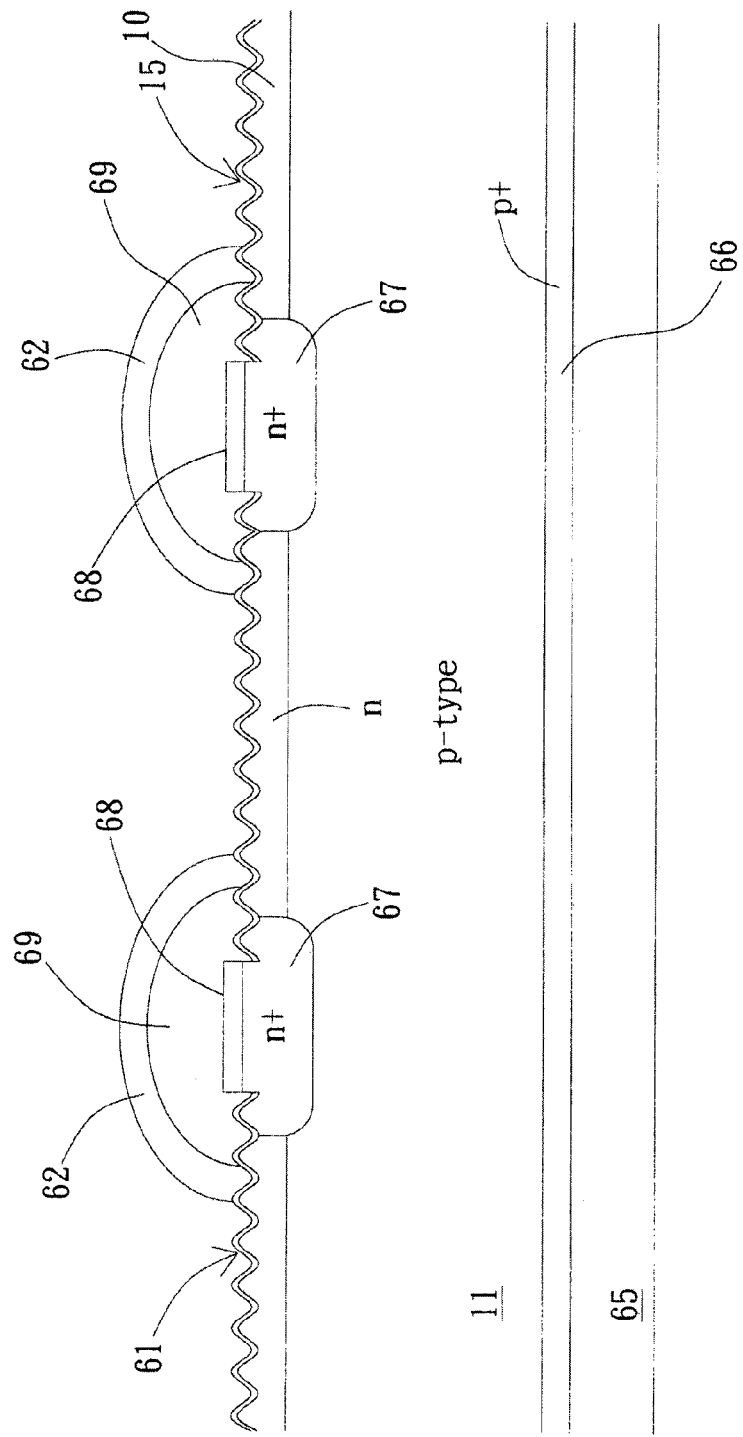
FIG. 6 diagrammatically illustrates a cross section of a laser doped solar cell.

By way of example and with reference to FIG. 6, a suitable fabrication sequence for the formation of a silicon solar cell incorporating localised molten regions of multiple dopant and/or impurity types is as follows:
1. Alkaline texturing 61 of the front or light receiving surface of the p-type wafer 11
2. Front surface diffusion of n-type dopants 10. The emitter diffusion is performed using a tube or belt furnace to achieve a sheet resistance of 50-250 ohms/sq. On the finished cell, the sheet resistance will preferably be in the range of 80-200 ohms/sq (nominally 120 ohms/sq), however this final value may be different to the emitter sheet resistivity directly following the emitter diffusion due to changes which occur during processing such as emitter etch back which increases the sheet resistance or drive in processes which reduce the sheet resistance.
3. Rear surface etch/edge junction isolation/phosphosilicate glass removal from the front surface. Optionally an emitter etch back process may be incorporated at this stage.
4. ARC deposition on the front surface by PECVD 15. This may be a single hydrogen rich layer of SiNx or SiOxNy with a refractive index of 2.0-2.1 and thickness for 70-80 nm or multiple dielectric layers where the roles of surface passivation, defect minimisation and optical effects are separated and independently achieved by different layers
5. Screen printing of the rear (non light receiving) surface with aluminium for the rear contact 65, followed by belt furnace firing at 650-1000 C but preferably in the range of 800-880 C to sinter the rear contact 65 and form the back surface field 66 by the formation of an aluminium/silicon alloy and liquid phase epitaxial growth during cooling.
6. Application of a dopant and/or impurity containing layer onto the front surface whereby the layer contains at least one dopant (preferably phosphorus) or impurity type (such as nickel) such that when subsequently forming the localised molten region with the laser, the material after solidification contains at least one region where each of two dopants or one dopant and one impurity type all have concentrations above $1 \times 10^{15}$ cm$^{-3}$.
7. Localised laser melting of the top surface of the wafer using a CW laser to simultaneously melt and dope the light receiving surface of the silicon, create heavily doped n+ regions 67 and remove the overlying dielectric layer(s) 15 for the formation of self-aligned front metal contacts. The low segregation coefficient of nickel in silicon results in nickel 68 resolidifying near the surface of the laser doped region and far from the junction where it could cause damage to the electrical properties of the device. The laser doping using an externally applied dopant source is performed to achieve a junction depth in the range of 4-20 microns and preferably in the range of 5-8 microns, with a corresponding localised sheet-resistance of 0.1-200 ohms/sq and preferably in the range of 1-40 ohms/sq.

8. A dilute HF dip to remove any oxide or surface layers on the nickel layer 68
9. Plating a layer of copper 69 over the nickel 68 to a thickness in the range of 1-25 microns but preferably in the range of 5-15 microns (nominally 10 microns)
10. Capping the copper layer 69 with a layer of tin or silver 62 to protect the copper. The tin or silver has a thickness in the range of 0.005-1 microns, but preferably in the range of 0.01-0.1 microns. Alternatively the copper layer can be eliminated and replaced by a silver layer of the same dimensions as the copper layer it replaces.

Example 2

Figure 7:
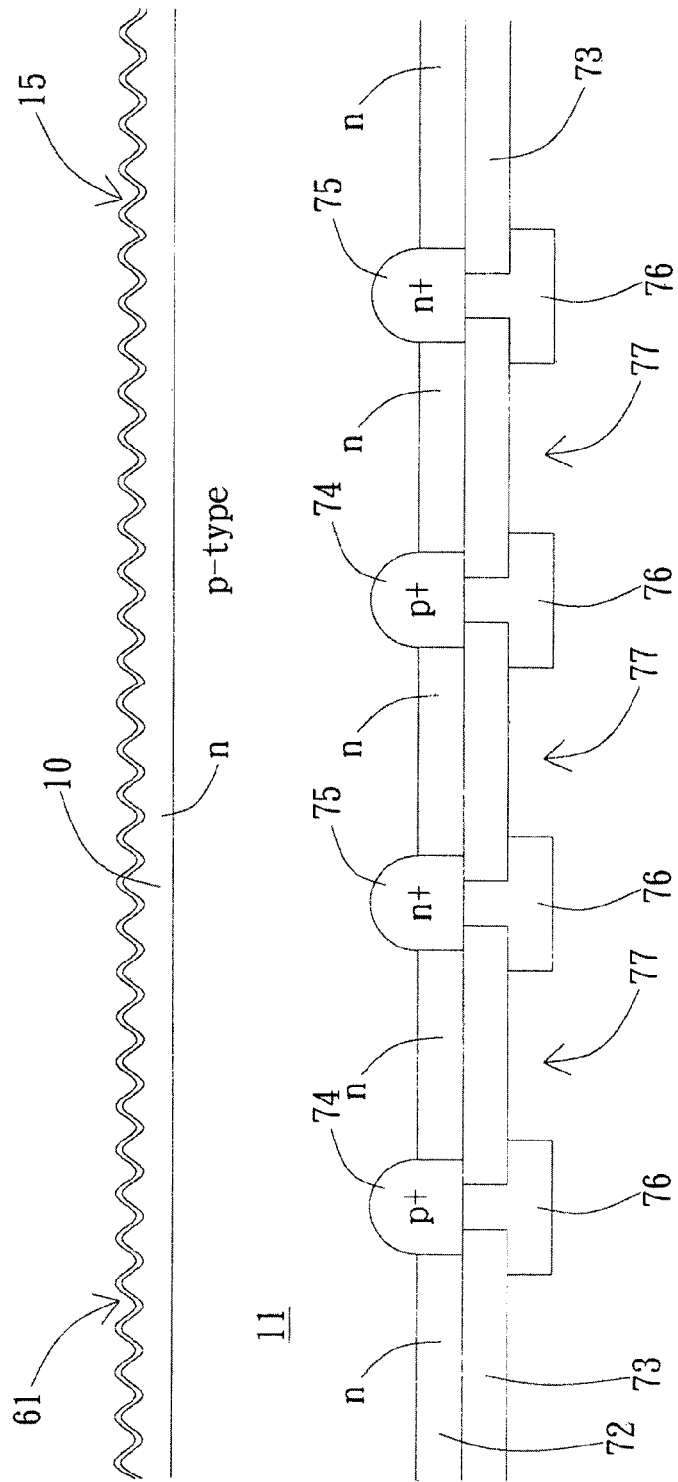
FIG. 7 diagrammatically illustrates a cross section of an interdigitated back contact solar cell.

Fabrication of Laser Doped Interdigitated Back Contact Solar Cell Using CW Laser By way of example and with reference to FIG. 7, a suitable fabrication sequence for the formation of an interdigitated back contact silicon solar cell incorporating localised molten regions of multiple dopant and/or impurity types is as follows:
1. Alkaline texturing 61 of the front or light receiving surface of the p-type wafer 11.
2. Front 10 and rear 72 surface diffusion of n-type dopants. The diffusion is performed using a tube or belt furnace to achieve a sheet resistance on the rear surface of 50-250 ohms/sq (preferably in the range of 100-200 ohms/sq).
3. ARC deposition on the front surface by PECVD 15. This may be a single hydrogen rich layer of SiNx or SiOxNy with a refractive index of 2.0-2.1 and thickness for 70-80 nm or multiple dielectric layers where the roles of surface passivation and optical effects are separated and independently achieved by different layers.
4. PECVD deposition on the rear surface for passivation 73. This may be a single hydrogen rich layer of SiNx or SiOxNy or other dielectric layer, or multiple dielectric layers where the roles of surface passivation, defect minimisation and electrical isolation are separated and independently achieved by different layers. The thickness of the rear surface passivation layer is in the range of 70-500 nm thick, with a preferred range of 150-250 nm*.

*Alternatively, if the rear passivation layer is capped, with AlxOy in step 4, the aluminium atoms present in this layer could be used as the source of p-type dopants for the rear contacts. In this case, the n-type dopant source (step 7) for forming the n-type contacts in step 8 would need to contain enough n-type dopants to overcome the p-type aluminium dopant source in order to form a heavily doped n+ laser doped region. Alternatively, after p-type contact formation, the AlxOy layer could be removed by an HF dip prior to n-type contact formation.

5. Application of a dopant and/or impurity containing layer onto the rear surface whereby the layer contains at least one dopant (preferably boron) such that when subsequently forming the localised molten region with the laser, the material after solidification contains at least one region where each of two dopants or one dopant and one impurity type all have concentrations above $1 \times 10^{15}$ cm$^{-3}$.
6. Localised laser melting of the rear surface of the wafer using a CW laser to simultaneously melt and dope the rear surface of the silicon, create heavily doped p+ regions 74 and remove the overlying dielectric layer(s). By using a heating regime whereby adequate mixing of dopants within the molten region is allowed, the dopants from the n-type emitter can be smeared out and substantially reduced. At the same time, the added p-type dopants can be incorporated to higher levels than that of the n-type dopants and hence the molten region becomes p-type, allowing direct contact to the p-type base to contact the base p-type silicon. Alternatively, by using a heating regime whereby adequate mixing of dopants within the molten region is not allowed, the different diffusion coefficients will determine how far each dopant diffuses into the molten region, with the result of the formation of p-n-p transistor structures if correct heating parameters are chosen. Provided the diffusion length of the n-type region is greater than its width, holes can diffuse across this region with a similar result to that if the p-type doped region was in direct contact with the p-type base. The laser doping using an externally applied dopant source is performed to achieve a junction depth in the range of 4-20 microns and preferably in the range of 5-8 microns, with a corresponding localised sheet-resistance of 0.1-200 ohms/sq and preferably in the range of 1-40 ohms/sq. This is followed by a rinse step to remove excess dopant layer.
7. Application of a dopant and/or impurity containing layer onto the rear surface whereby the layer contains at least one dopant (preferably phosphorus) such that when subsequently forming the localised molten region with the laser, the material after solidification contains at least one region where each of two dopants or one dopant and one impurity type all have concentrations above $1 \times 10^{15}$ cm$^{-3}$.
8. Localised laser melting of the rear surface of the wafer using a CW laser to simultaneously melt and dope the rear surface of the silicon, create heavily doped n+ regions 75 to form the emitter contacts and remove the overlying dielectric layer(s). The laser doping using an externally applied dopant source is performed to achieve a junction depth in the range of 4-20 microns and preferably in the range of 5-8 microns, with a corresponding localised sheet-resistance of 0.1-200 ohms/sq and preferably in the range of 1-40 ohms/sq.
9. A dilute HF dip to remove any oxide or surface layers on the heavily doped phosphorus and boron doped silicon.
10. Deposition of a metal layer 76, preferably aluminium via a method such as e-beam, sputtering or thermal evaporation.
11. Patterning 77 of the metal layer to isolate p-type and n-type contacts from each other. Alternatively, plating could be used at step 10.
12. Sintering of wafer at low temperature in the range of 200 to 500° C., preferably 300° C. to improve contact resistance.

Example 3

Fabrication of Emitter Wrap-Through Solar Cell on a Thin Silicon Wafer

Figure 8:
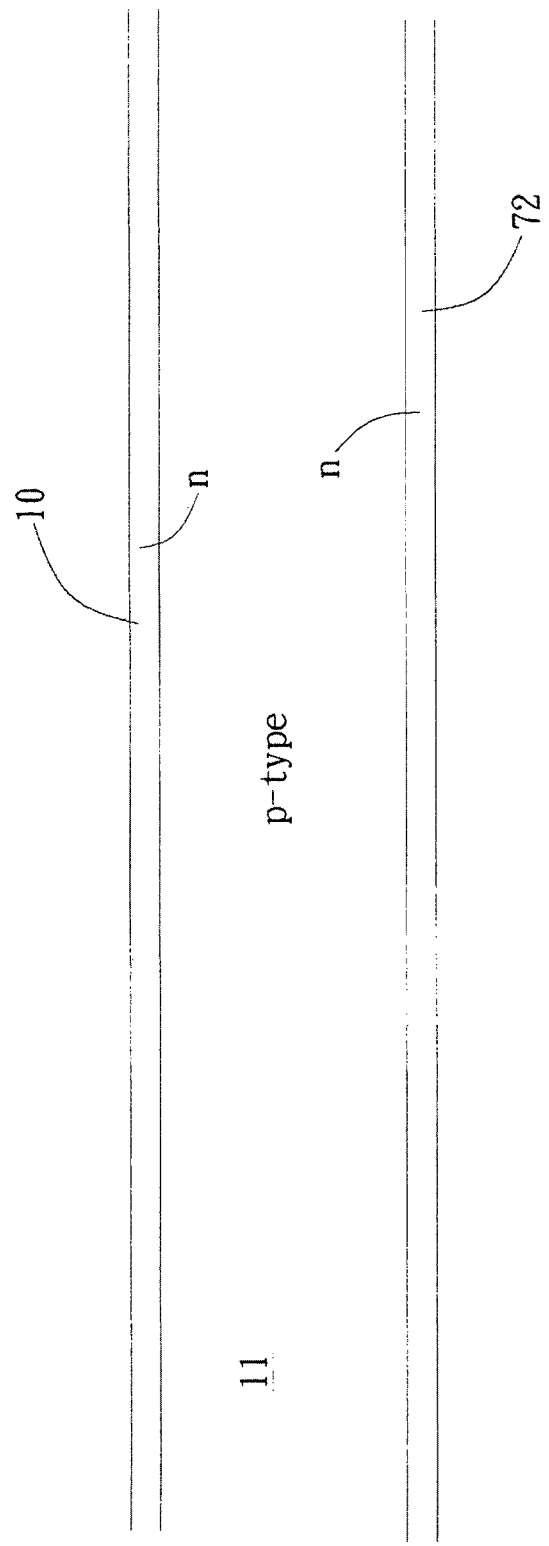
FIG. 8 diagrammatically illustrates a cross section of a starting wafer for thin Emitter Wrap Through (EWT) solar cell.
Figure 9:
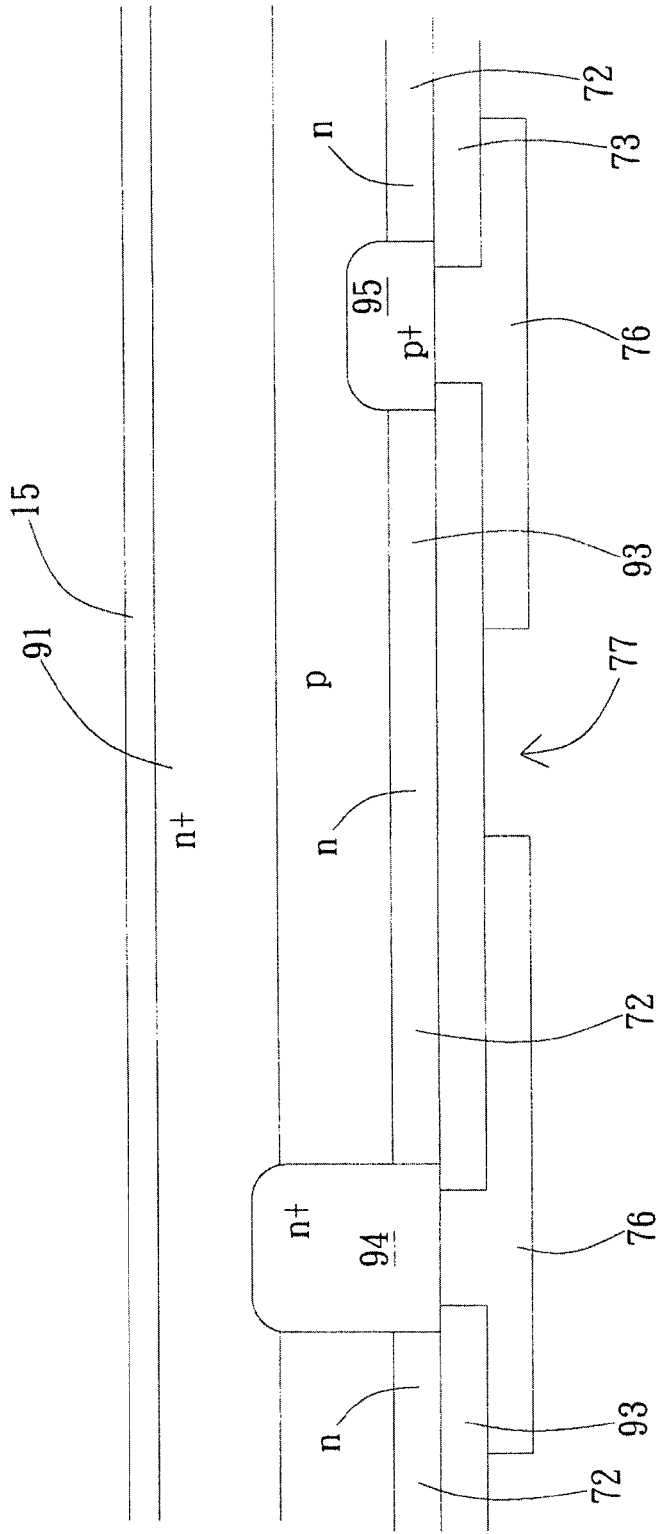
FIG. 9 diagrammatically illustrates a cross section of the thin EWT device in its final form.
Figure 10:
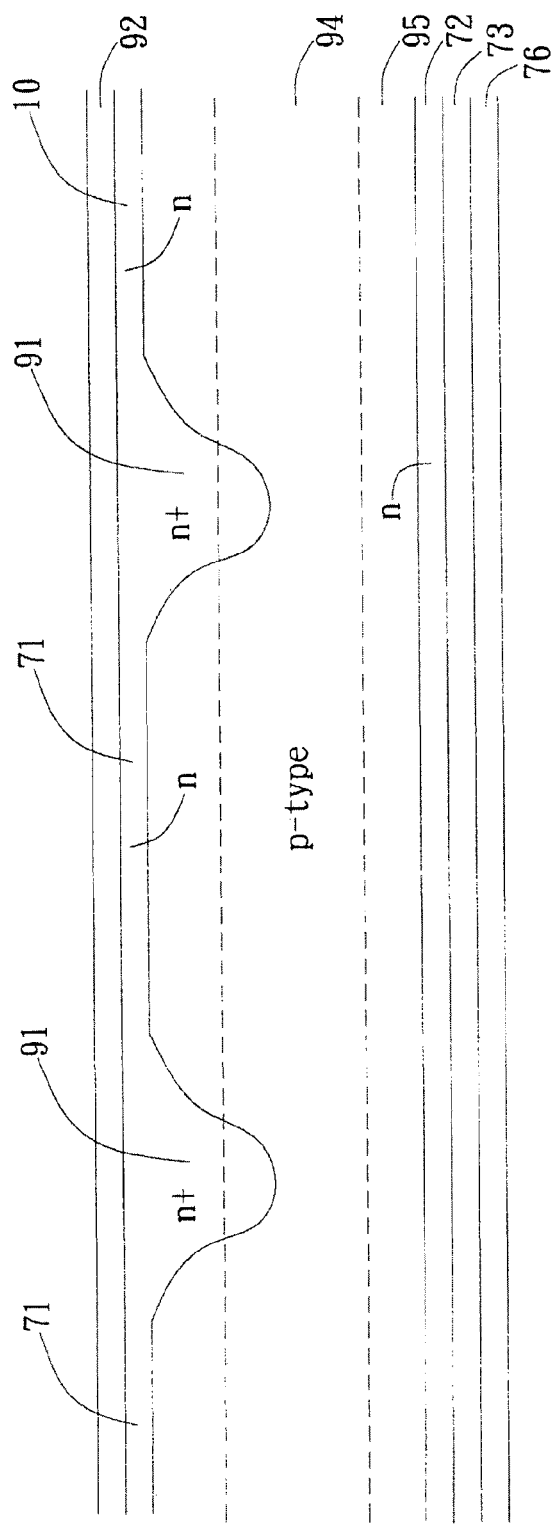
FIG. 10 diagrammatically illustrates a transverse cross section (relative to the view of FIG. 9) of the final form of the thin EWT device of FIG. 9.

This cell design demonstrates the ability to contact buried layers—both through an emitter of opposite polarity (p-type contacts through n-type emitter) and the joining of two layers of the same polarity which are less than 40 um apart. Referring to FIG. 8, the starting wafer in this example is 15 um thick and p-type 11, with n-type layers at the front 10 and rear 72. Referring to FIGS. 9 and 10 which are views in mutually transverse directions, n-type and p-type contacts are formed as in the IBC cell design in Example 2, but in addition, n-type laser doping 91 is used on the front of the device to connect with the n-type laser doped regions 94 on the rear. By forming these n-type regions on the front of the device 91 perpendicular to the n-type regions created from the rear of the device 94, n-type regions are formed through the entire device thickness at the intersections of the perpendicular lines, thereby connecting the front emitter 10 to the rear emitter 72, and creating a device with two collecting junctions. The depth of the n-type laser doped regions 91 and 94 should be chosen such that the regions will connect, whilst the depth of the p-type laser doped regions 95 should be chosen such that it will not connect with the n-type region doped from the front side of the device 91 to avoid shunting. By way of example and with reference to FIGS. 8, 9 and 10, a suitable fabrication sequence for the formation of an EWT silicon solar cell incorporating localised molten regions of multiple dopant and/or impurity types is as follows:

1. A 15 um p-type silicon wafer 11 is prepared with front 10 and rear 72 sides diffused n-type via either thermal diffusion, epitaxially grown layer or other means. These n-type layers are preferably 1 um or less in thickness.
2. Application of a dopant and/or impurity containing layer onto the front surface whereby the layer contains at least one dopant (preferably phosphorus) such that when subsequently forming the localised molten region with the laser, the material after solidification contains at least one region where each of two dopants or one dopant and one impurity type all have concentrations above $1 \times 10^{15}$ cm$^{-3}$.
3. Localised laser melting of the front surface of the wafer in a line pattern using a CW laser to simultaneously melt and dope the front surface of the silicon, create heavily doped n+ regions 91. In FIG. 9 these lines run across the page while in FIG. 10 they run into the page. The laser doping using an externally applied dopant source is performed to achieve a junction depth in the range of 8-10 um, with a corresponding localised sheet-resistance of 0.1-200 ohms/sq and preferably in the range of 1-40 ohms/sq.
4. Passivation layer deposition on the front surface 15 by PECVD. This may be a single hydrogen rich layer of SiNx or SiOxNy or other dielectric layer or multiple dielectric layers where the roles of surface passivation and optical effects are separated and independently achieved by different layers. The thickness of the rear surface passivation layer is in the range of 70-500 nm thick, with a preferred range of 150-250 nm.
5. Passivation layer deposition on the rear surface 73 by PECVD. This may be a single hydrogen rich layer of SiNx or SiOxNy or other dielectric layer or multiple dielectric layers where the roles of surface passivation, defect minimisation are separated and independently achieved by different layers.
6. Application of an n-type dopant and/or impurity containing layer onto the rear surface whereby the layer contains at least one dopant (preferably phosphorus) or impurity type (such as nickel) such that when subsequently forming the localised molten region with the laser, the material after solidification contains at least one region where each of two dopants or one dopant and one impurity type all have concentrations above $1 \times 10^{15}$ cm$^{-3}$.
7. Localised laser melting of the rear surface of the wafer in a line pattern using a CW laser to simultaneously melt and dope the rear surface of the silicon, create heavily doped n+ regions 94 and locally remove the overlying dielectric layer(s) 73 which is not parallel (and preferably perpendicular) to the n-type line pattern 91 on the front surface. By melting the lines such that they are not parallel to the lines on the front of the wafer, regions will intersect forming localised n-type doped vias in a self-aligned manner which connect the front emitter 10 to the rear emitter 72. In FIG. 9 these doped lines 94 run into the page and in FIG. 10 they run across the page. The laser doping using an externally applied dopant source is performed to achieve a junction depth in the range of 8-10 um, with a corresponding localised sheet-resistance of 0.1-200 ohms/sq and preferably in the range of 1-40 ohms/sq.
8. Application of a dopant and/or impurity containing layer onto the rear surface whereby the layer contains at least one dopant (preferably boron) such that when subsequently forming the localised molten region with the laser, the material after solidification contains at least one region where each of two dopants or one dopant and one impurity type all have concentrations above $1 \times 10^{15}$ cm$^{-3}$.
9. Localised laser melting of the rear surface of the wafer using a CW laser to simultaneously melt and dope the rear surface of the silicon, create heavily doped p+ regions 95 between the heavily doped n+ regions and locally remove the overlying dielectric layer(s) 73. As with the heavily doped n+ regions 94, in FIG. 9 the heavily doped p+ lines 95 run into the page and in FIG. 10 they run across the page. By using a heating regime whereby adequate mixing of dopants within the molten region is allowed, the dopants from the rear n-type emitter 72 can be smeared out and substantially reduced. At the same time, the added p-type dopants can be incorporate to higher levels than that of the n-type dopants and hence the molten region that will become the heavily doped p+ region 75 becomes p-type, allowing direct contact to the p-type base to contact the base p-type silicon 11 in the bulk of the device. The laser doping using an externally applied dopant source is performed to achieve a junction depth that is deeper than the thickness of the n-type emitter layer but shallower than the distance from the rear surface of the wafer to the point wafer where the front n-type laser doped region 91 penetrate to. Preferably this ideal depth would be in the range of 2-4 microns, with a corresponding localised sheet-resistance of 0.1-200 ohms/sq and preferably in the range of 1-40 ohms/sq. This may be performed in a line pattern, point contact pattern or geometry.
10. A dilute HF dip to remove any oxide or surface layers on the heavily doped phosphorus and boron doped silicon.
11. Deposition of a metal layer 76, preferably aluminium via a method such as e-beam, sputtering or thermal evaporation.
12. Patterning of the metal layer to isolate p-type and n-type contacts from each other 77.

Note: wafer would also be textured at the front surface (not shown).

Example 4

Figure 11:
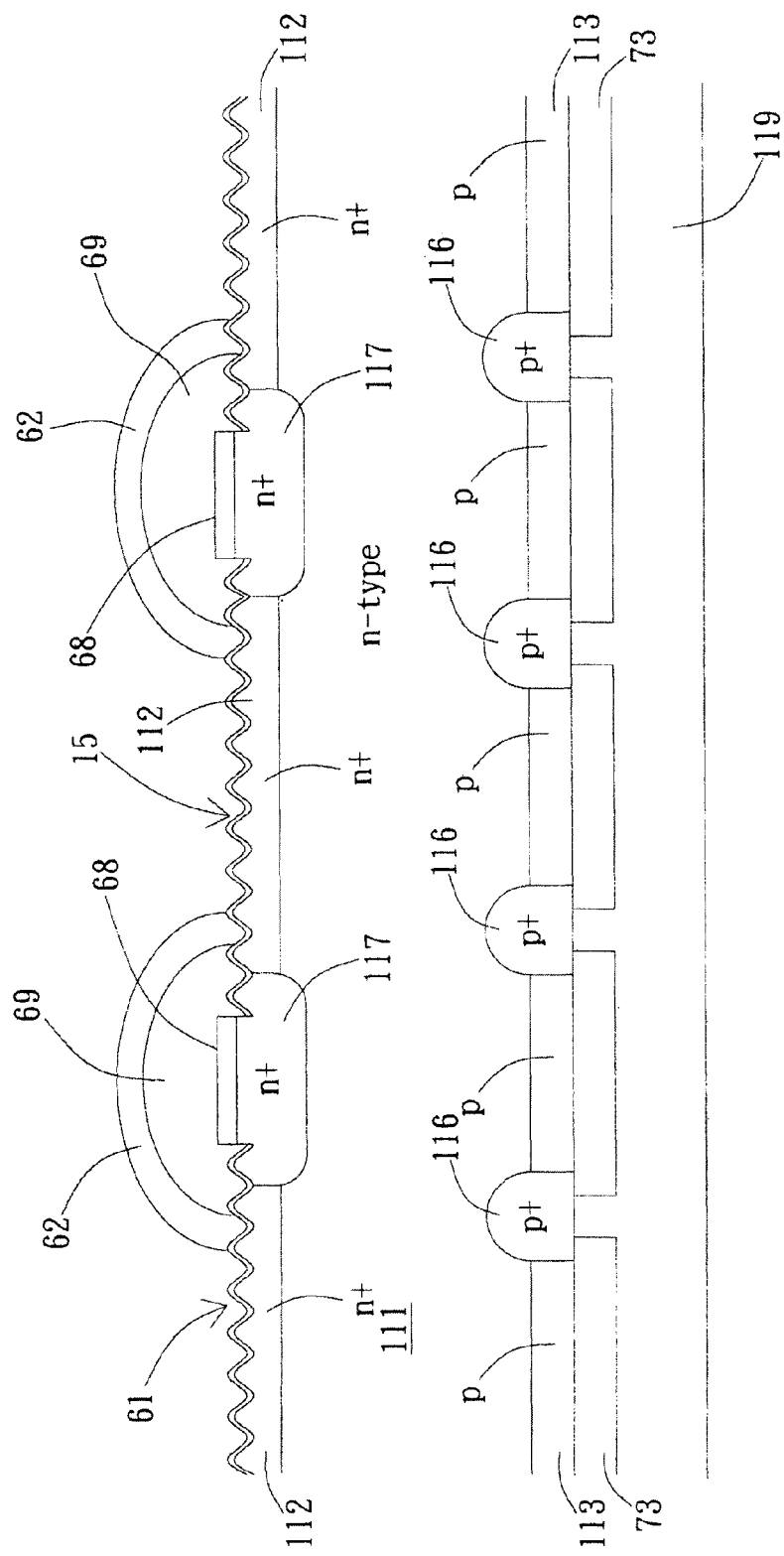
FIG. 11 diagrammatically illustrates a cross section of an n-type rear junction double sided laser doped solar cell with $Al_xO_y$ rear passivation layer.

Fabrication of n-Type Rear Junction Double Sided Laser Doped Solar Cell with $Al_xO_y$ Rear Passivation Layer Referring to FIG. 11, an n-type rear junction double sided laser doped solar cell with $Al_xO_y$ rear passivation layer is fabricated using the following process:

1. Alkaline texturing 61 of the front or light receiving surface of the n-type wafer 111.
2. Front surface diffusion of n-type dopants to form front surface field (FSF) 112. The FSF diffusion is performed using a tube or belt furnace to achieve a sheet resistance of 200-1000 ohms/sq. On the finished cell, the sheet resistance will preferably be in the range of 250-2000 ohms/sq but preferably 400-600 ohms/sq, however this final value may be different to the emitter sheet resistivity directly following the emitter diffusion due to changes which occur during processing such as emitter etch back which increases the sheet resistance or drive in processes which reduce the sheet resistance.
3. Rear surface etch/edge junction isolation/PSG removal from the front surface. Optionally an emitter etch back process may be incorporated at this stage.
4. Optional formation of a diffusion barrier on the front surface such as PECVD SiO2, or formation of a diffusion barrier on both surfaces such as thermal SiO2 and subsequent removal of the rear diffusion barrier. If using a high temperature thermal oxide, this process may also be used as an emitter drive in step.
5. Rear surface diffusion of p-type dopants to form rear emitter 113. The emitter diffusion is performed using a tube or belt furnace to achieve a sheet resistance of 100-1000 ohm/sq. On the finished cell the sheet resistance will preferably be in the range of 120-1000 ohms/sq but preferably in the range of 200-500 ohms/sq, however this final value may be different to the emitter sheet resistivity directly following the emitter diffusion due to changes which occur during processing such as emitter etch back which increases the sheet resistance or drive in processes which reduce the sheet resistance.

6. Boron Silicate Glass (BSG) removal from the rear surface. Optionally an emitter etch back process may be incorporated at this stage which simultaneously be used to remove the front diffusion mask layer.

7. An optional emitter drive in step may be performed, which can simultaneously grow a thermal $SiO_2$ layer in the range of 2-200 nm (preferably in the range of 10-20 nm).

8. ARC deposition on the front surface by PECVD 15. This may be a single hydrogen rich layer of SiNx or SiOxNy with a refractive index of 2.0-2.1 and thickness for 70-80 nm or multiple dielectric layers where the roles of surface passivation, defect minimisation and optical effects are separated and independently achieved by different layers 9. PECVD deposition of $Al_xO_y$ or a stack of layers containing $Al_xO_y$ on the rear 73 for rear surface passivation and as the dopant source for the subsequent rear contact formation with the thickness of the $Al_xO_y$ layer being in the range of 10-500 nm and preferably in the range of 150-250 nm. Preferably the $Al_xO_y$ layer is capped by another PECVD layer such as $SiN_x$ or $SiO_xN_y$ to prevent attack of the $Al_xO_y$ layer by subsequent chemical processes.

10. Localised laser melting of the rear surface of the wafer using a CW laser to simultaneously melt and dope the non-light receiving surface of the silicon, create heavily doped p+ regions 116 and remove the overlying dielectric layer for the formation of rear locally diffused contacts to the emitter 113. With aluminium being the dopant, and oxygen atoms in the wafer being a second impurity type, aluminium oxide complexes will form in the doped region. However, due to the low segregation coefficient of aluminium, there will be minimal aluminium atoms that resolidify in the silicon near to where the junction is formed (as the junction is the first area to resolidify) thereby not deteriorating the quality of the junction. A high concentration of aluminium will be incorporated near the surface of the laser doped region (the region to solidify last) providing a good surface to form metal contact to and far enough away from the junction to not significantly damage the electronic properties of the device. The laser doping using the $Al_xO_y$ dielectric layer as a dopant source is performed to achieve a junction depth in the range of 4-20 microns and preferably in the range of 5-8 microns, with a corresponding localised sheet-resistance of 0.1-200 ohms/sq and preferably in the range of 1-40 ohms/sq.

11. Application of a dopant containing layer onto the front surface whereby the layer contains at least one dopant (preferably phosphorus) and/or impurity type (such as nickel) such that when subsequently forming the localised molten region with the laser, the material after solidification contains at least one region where each of two dopants or one dopant and one impurity type all have concentrations above $1 \times 10^{15}$ $cm^3$.

12. Localised laser melting of the top (front) surface of the wafer using a CW laser to simultaneously melt and dope the light receiving surface of the silicon, create heavily doped n+ regions 117 and remove the overlying dielectric layer(s) for the formation of self-aligned front metal contacts to the base 111. The low segregation coefficient of nickel in silicon results in nickel 68 resolidifying near the surface of the laser doped region and far from the junction where it could cause damage to the electrical properties of the device. The laser doping using an externally applied dopant source is performed to achieve a junction depth in the range of 4-20 microns and preferably in the range of 5-8 microns, with a corresponding localised sheet-resistance of 0.1-200 ohms/sq and preferably in the range of 1-40 ohms/sq.

13. A dilute HF dip to remove any oxide or surface layers on the heavily doped p+ regions 116.

14. Deposition of a metal layer 119, preferably aluminium via a method such as e-beam, sputtering or thermal evaporation.

15. A dilute HF dip to remove any oxide or surface layers on the nickel layer 68.

16. Plating a layer of copper 69 over the nickel 68 to a thickness in the range of 1-25 microns but preferably in the range of 5-15 microns (nominally 10 microns).

17. Capping the copper layer 69 with a layer of tin or silver 62 to protect the copper. The tin or silver has a thickness in the range of 0.005-1 microns, but preferably in the range of 0.01-0.1 microns. Alternatively the copper layer can be eliminated and replaced by a silver layer of the same dimensions as the copper layer it replaces.

Laser Operation

Figure 21:
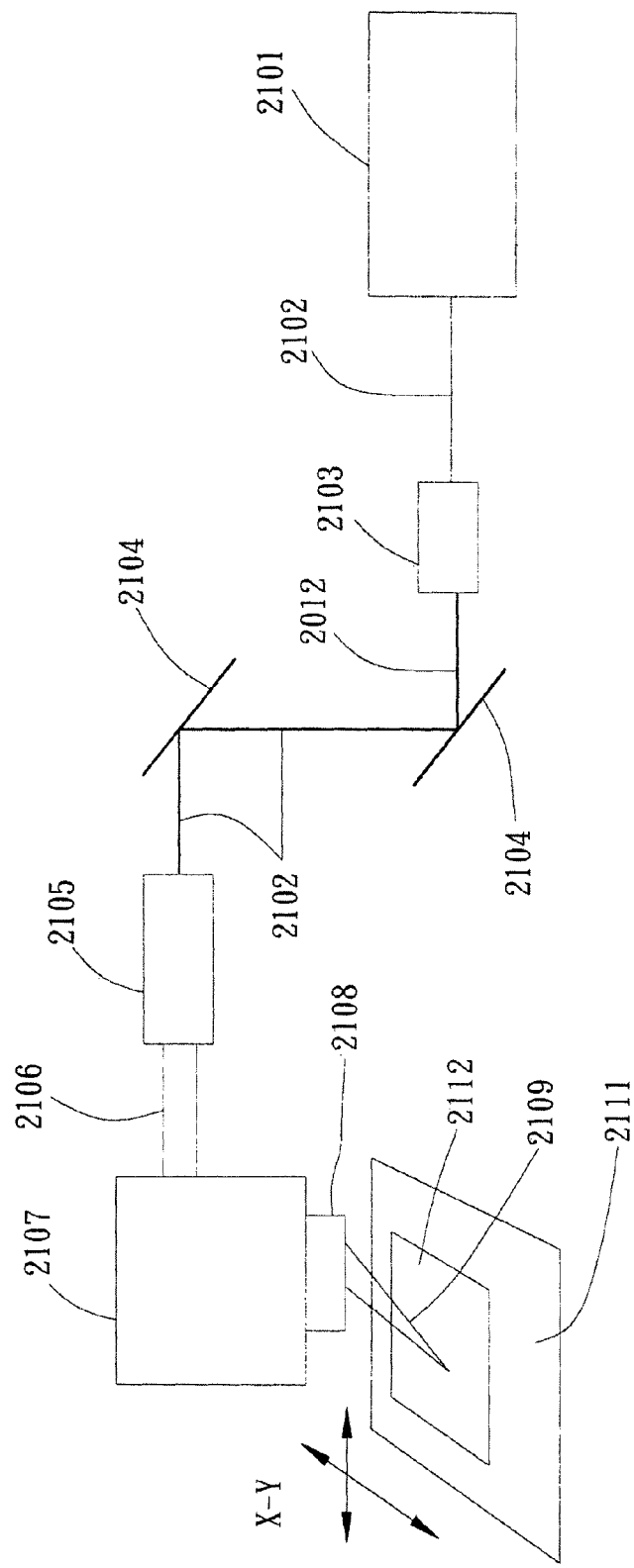
FIG. 21 shows a laser system configuration of a laser heating arrangement for melting silicon.

The laser heat source used to melt the silicon to achieve distribution of the impurities in a desired profile through the silicon after re-solidification may be a CW laser, a pulsed laser or a Pseudo CW laser. Referring to FIG. 21, a heating arrangement employing a CW laser is illustrated. The CW laser 2101 emits a beam 2102, which passes through a beam modifying device such as a shutter 2103. After emerging from the shutter 2103 the beam 2102 is reflected by mirrors 2104 which direct the beam through a Beam expansion telescope 2105 to form the expanded beam 2106 which is directed at the galvanometer scanner 2107. The Galvanometer scanner 2107 deflects the beam through an f-theta lens 2108 which focuses the beam 2109 onto the surface of the substrate 2112 which is being processed. The deflection of the laser beam by the galvanometer scanner 2107 causes the focused beam 2109 to be rapidly scanned over the surface of the substrate 2112 which is being processed. Alternatively the silicon substrate 2112 may be mounted on an X-Y translation table and the galvanometer scanner 2107 may be held stationary (or replaced by a fixed mirror) and scanning of the beam over the surface of the substrate may be achieved by moving the X-Y translation table to move the substrate under the table. A combination of the X-Y table 2111 and the galvanometer scanner 2107 might also be used in some cases such that the X-Y table is used to locate the beam in a region of the substrate and the galvanometer scanner is used to rapidly scan the beam 2109 over the surface of the substrate over a small area in the region of the substrate determined by the X-Y Table. The shutter 2103 might be replaced in some instances by an opto-electronic modulator or an acousto-optic modulator. For q-switched lasers, which will be used to implement a pseudo CW laser, a similar configuration to that described above will be used but some components in the beam path will need to be changed to accommodate the higher peak powers of the laser pulses.

In laser heating steps, the temporal power profile of a laser beam reaching a given point on the silicon may be controlled to result in various dopant profiles of the impurities by changing the rate of application and/or removal of the heat source, and the duration for which the heat source is applied. One way to achieve this is by spatial beam shaping to adjust the spatial power profile of the laser beam in conjunction with scanning the laser relative to a given point on the silicon to result in a temporal variation in the beam power at a given point on the silicon, particularly for the case of CW lasers or pseudo CW lasers where the silicon does not re-solidify between successive pulses. In this instance spatial beam shapes such as Gaussian, top-hat or various other shapes may be used to result in various temporal power profiles reaching the silicon described in the examples below.

Other approaches control the temporal power profile of the beam reaching a given point on the silicon in a number of ways. The speed at which a laser beam is scanned relative to a given point on the silicon may be controlled by either using a fixed beam with the silicon wafer moving during the laser process, a stationary silicon wafer with a moving laser beam such as that produced by a galvanometer scanner, or moving both the laser beam and silicon wafer.

Figure 17:
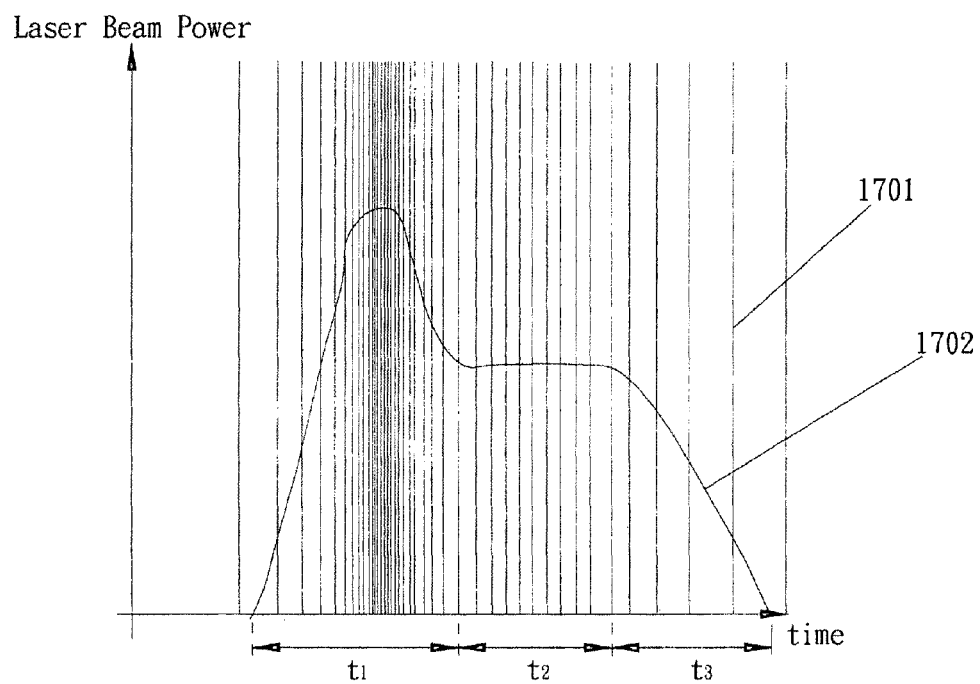
FIG. 17 graphically shows a temporal beam power profile of a pulsed laser in which pulse spacing is varied to vary the longer term average power delivered to the silicon surface. The vertical lines denote the instantaneous power levels of the pulses as a function of time. The smoother curve shows the longer-term average power of the pulses as a function of time during the pulse train.

Shutters such as acousto-optic or opto-electronic modulators may also be used to control the temporal power profile of the beam at a given point on the silicon particularly when using CW or pseudo-CW lasers. Where a pulsed laser is used the pulse itself may be shaped temporally to control the temporal power profile on the silicon. For pulsed lasers with sufficiently high pulse frequencies, preferably higher than 100 MHz such that the silicon absorbing the energy does not have time to appreciably change temperature between the pulses due to the silicon's thermal conductivity, the silicon effectively filters the pulse waveform of the incoming laser beam. Hence it is the average power delivered to the silicon during a given time interval which is important. To change the average power delivered to the silicon over a given time interval the period between successive pulses may be varied, whereby for pulses of similar energy, the average power supplied for a given time period increases as the pulse frequency is increased. As illustrated in FIG. 17, a series of pulses 1701 each of similar energy and peak power may be generated with variations in the period between successive pulses to effectively create over the longer term a single pulse having an average power versus time profile 1702. The same outcome may also be achieved using multiple approaches such as the use of high speed shutters or modulators on a CW or pseudo CW laser to control the beam temporal power profile reaching the wafer, by the use of temporal pulse shaping of individual pulses of a pulsed laser, or by spatial beam shaping for a scanned CW or pseudo CW laser. The resultant shape of the power versus time profile in FIG. 17 shows an initial high beam power of duration $t_1$ to melt the silicon, a reduced beam power for duration $t_2$ to maintain the silicon in a molten state and expand the molten region if required and prevent ablation of the silicon, and a further reduction of beam power for duration $t_3$ to allow the silicon to re-solidify. In order to ensure that a similar impurity profile is achieved at different points of the semiconductor device when using such approaches, it is preferable that the beam is stationary relative to a given point on the semiconductor device while the silicon is molten. However for appropriately short time scales in relation to a scanning speed it may be possible to achieve a relatively similar impurity profile at different points of the semiconductor device without stopping the motion of the laser beam.

Furthermore, to achieve the desired impurity profile, more than one of the aforementioned methods may be used. In some applications it may be desirable to change the temporal power profile of the beam reaching the silicon when it scans over different areas on the semiconductor surface to result in different impurity profiles of a given impurity type at different areas on the semiconductor surface.

In order to obtain a typical impurity profile dominated by diffusion of a given impurity type, the time during which the silicon remains molten may be kept short such that the diffusion length of the given impurity type is sufficiently small in relation to the depth of the molten region to prevent the diffusion of the given impurity type in sufficient quantities to reach the deepest regions of molten silicon. Furthermore, the rate of solidification of the molten region should be sufficiently fast in relation to the diffusion coefficient of the given impurity type to restrict diffusion of the impurity type within the remaining molten silicon region as it recrystallizes and to reduce the effect of segregation. For sufficiently rapid rates of recrystallization the effects of segregation can be eliminated to achieve an impurity profile which is entirely dependent on the diffusion coefficient of the impurity type. For example, assuming a source of impurities is introduced into the silicon during a laser doping step, in order to get a variation in the impurity concentration of the impurity at the surface more than 1000 times higher than that at the greatest depth in the molten region, the diffusion length of the impurity needs to be smaller than approximately 20% of the depth of molten silicon. For the case of phosphorus for a 10 micron deep volume of molten silicon, the time the silicon is molten for should be less than approximately 50 microseconds. For the case of iron, with a diffusion length approximately 19 times smaller than that of phosphorus, the maximum time allowable is approximately 19 times longer, at approximately 910 microseconds.

Figure 12A:
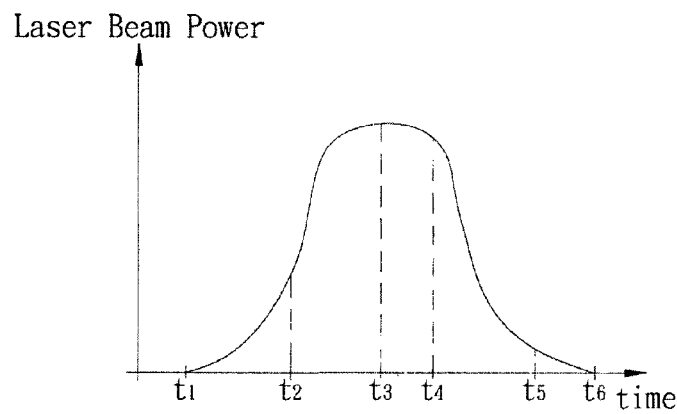
FIGS. 12a, b & c graphically show respectively: a) the beam power projected onto a point on the surface of the silicon device as a function of time for CW laser with a Gaussian spatial beam power profile in the direction of travel scanned with a constant speed over the given point; b) the melt depth versus time at the point on the silicon scanned over by the laser beam shown in a); and c) the resultant spatial impurity profile (impurity concentration versus depth normalised to unity at the surface) after the silicon has solidified.
Figure 12B:
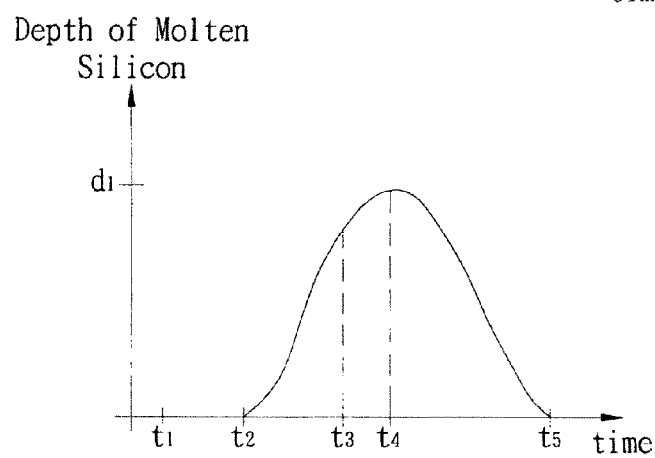
Figure 12C:
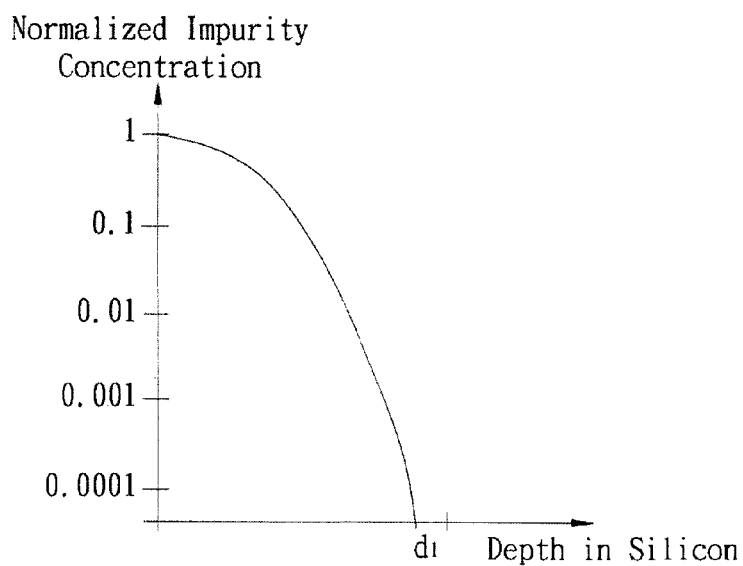

When using a CW or pseudo CW laser, this may be achieved by using a sufficiently narrow laser beam with a Gaussian spatial power profile and a sufficiently fast scan speed in relation to the diffusion length of the impurity type and depth of molten silicon such as by using a silicon device with a phosphorus dopant and using a 532 nm wavelength CW laser with a 20 micron beam diameter providing 13 W of optical power reaching the silicon device and a scan speed of 10 m/s. With reference to FIG. 12, assuming a Gaussian spatial beam profile in the direction of travel of a CW laser operating with a linear scan speed, the power reaching a given point on the wafer under illumination as a function of time, as shown in FIG. 12a, also follows a Gaussian distribution. The corresponding depth of molten silicon as a function of time is shown in FIG. 12b. At time $t_1$, the laser beam commences illumination of the given position on the semiconductor device; however the energy deposited is too low to melt any silicon. At time $t_2$, the energy supplied to the silicon is sufficient to melt the surface of the silicon and as the energy supplied by the laser continues to increase, the depth of molten silicon increases. At time $t_3$, the given position on the semiconductor device sees the peak power supplied by the laser with the depth of molten silicon still continuing to increase, then the power supplied by the laser begins to decrease. At time $t_4$, the molten silicon reaches its maximum depth ($d_1$). The silicon then begins to solidify until time $t_5$ when all of the silicon has re-solidified. At time $t_6$ all laser illumination is removed from the position on the semiconductor device. It should be noted that for sufficiently fast scan speeds, it may be possible for $t_6$ to occur prior to $t_5$. A typical spatial diffusion profile (impurity concentration versus depth) from such a process is shown in FIG. 12c.

Figure 20:
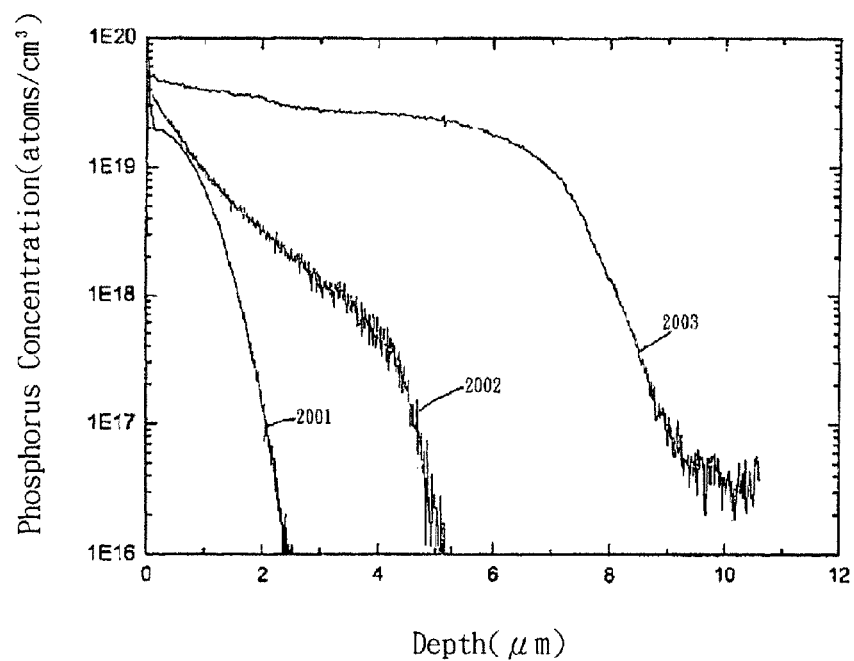
FIG. 20 graphically shows a measured diffusion spatial profile using the beam parameters described with reference to FIGS. 12 and 15.

Referring to FIG. 20, a graphical representation of three measured diffusion profiles is shown. One of these profiles 2001 uses the beam parameters mentioned above with reference to FIG. 12 and is shown for a scan speed of 10 m/s (2001).

Figure 13A:
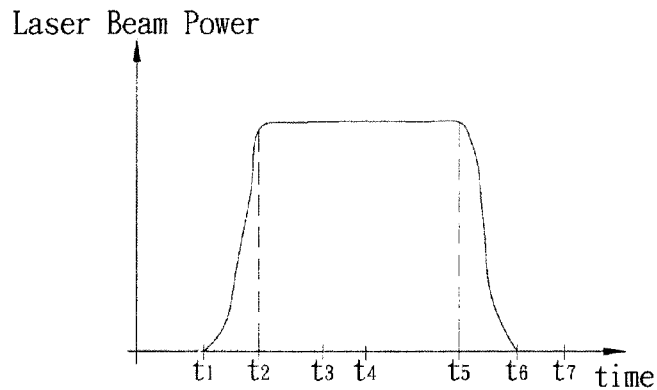
FIGS. 13 a, b, & c graphically show curves similar to those of FIG. 12 when the laser has a "Top Hat" spatial beam power profile in the direction of travel.
Figure 13B:
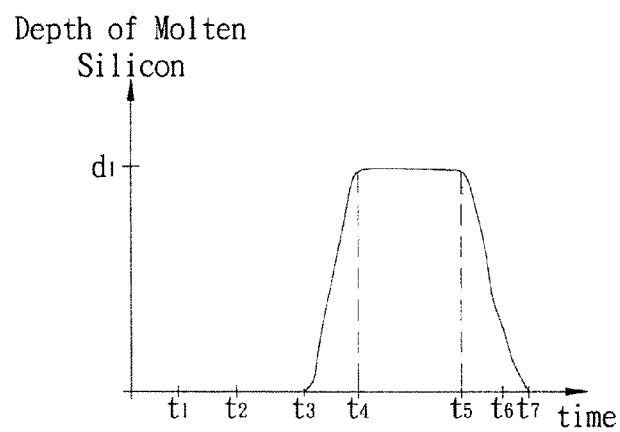
Figure 13C:
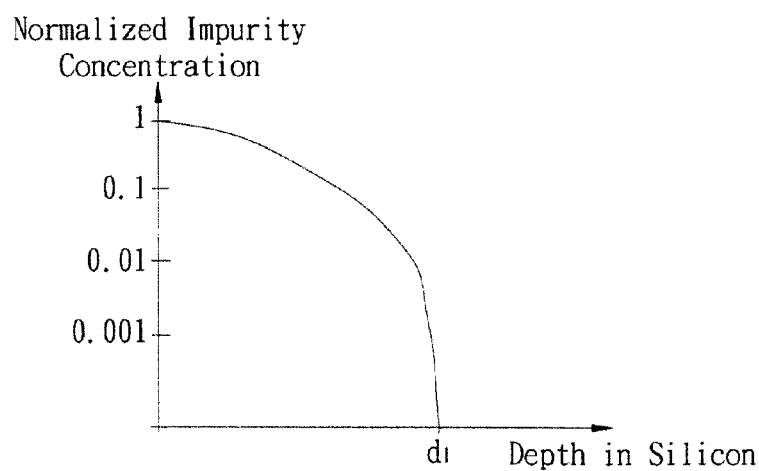

Furthermore, by more rapidly removing the heat source such as by using a beam with a sharper spatial decay of beam power at the tail of the laser beam in the direction of travel, and preferably a top hat (i.e. mainly flat) beam spatial power profile, the rate of cooling and hence solidification can be enhanced. With reference to FIG. 13, when an approximate top-hat spatial distribution of power supplied to the silicon wafer in the direction of travel of a CW laser which operates with the same linear scan speed as for the example of FIG. 12, the power that will reach a given point on the semiconductor device while the laser scans past the point, is shown as a function of time in FIG. 13a. It will be seen that the illumination of the given point as the laser scans past also follows an approximate top-hat distribution. The corresponding depth of molten silicon as a function of time is shown in FIG. 13b. At time $t_1$, the laser illumination commences at the given position on the semiconductor device; however the energy delivered is too low to melt the silicon. A short time later at time $t_2$, the power supplied to the silicon reaches an approximate maximum value, which is substantially maintained until time $t_5$. The silicon continues to increase in temperature until time $t_3$ when the silicon at the surface of the semiconductor device begins to melt. At time $t_4$ the molten silicon reaches its maximum depth ($d_1$). At time $t_5$ the power supplied to the silicon from the laser begins to decrease at which time the depth of molten silicon begins to decrease as the silicon solidifies. A short time later at time $t_6$ the illumination is completely removed from the point (i.e. the laser has moved past the point) and the silicon begins to re-solidify until time $t_7$ when all of the silicon has re-solidified. A typical spatial diffusion profile is shown in FIG. 13c which shows a similar profile to that obtained in FIG. 12c assuming the silicon at the surface remains molten for a similar time and the temperature of the molten silicon is similar in both cases.

Similarly, the scan speed could be increased to result in a faster solidification rate, however this would result in the silicon remaining molten for a shorter period of time and shallower spatial impurity profile due to less diffusion of the impurities. To maintain the silicon molten for the same duration and hence achieve the same impurity profile depth, when using an increased scan speed it is preferable to use a laser beam with a spatial shape-which is elongated in the direction of travel, such as a line laser.

Figure 18:
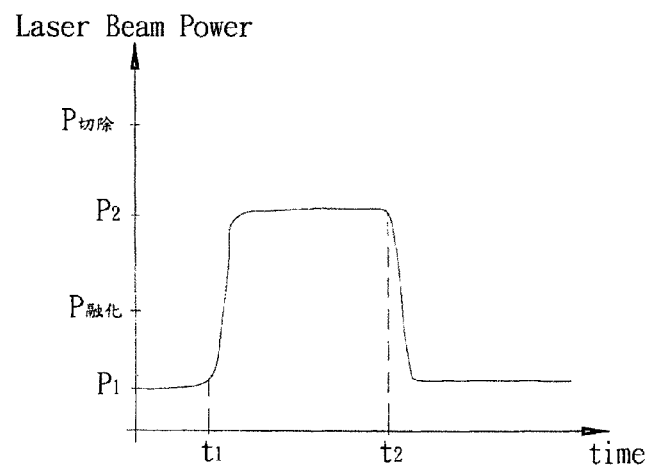
FIG. 18 graphically shows the power delivered over time by a CW laser directed via a high speed shutter.

Alternatively, for CW or pseudo CW laser beams of various beam spatial power profiles such as Gaussian or top hat profiles and elongated beam spatial shapes such as line lasers may be held stationary whilst forming each molten region, and maintaining the silicon in the molten state for a predetermined time to result in the desired depth of molten silicon and impurity distribution. Subsequently the laser illumination may be removed, preferably by operating a shutter in the beam path to permit abrupt removal of the laser illumination from the molten silicon. This will result in rapid solidification of the silicon. In this instance, if there is some illumination reaching the wafer whilst the shutter is closed, it is preferable that this is below the threshold to melt the silicon. With reference to FIG. 18, a CW laser is used with a high speed shutter such that initially the shutter is closed, but still allows a small amount of power $P_1$ to pass through the shutter to reach the silicon. However the power level $P_1$ is below the level ($P_{melt}$) required to supply sufficient energy within a reasonable time period $t_1$ to melt the silicon. At time $t_1$ the shutter is opened and the beam power ramps up to reach the pre-determined power level $P_2$ corresponding to the open state of the shutter and sufficient to cause melting of the silicon. At time $t_2$, the shutter is again closed which reduces the power of the beam to $P_1$ and the silicon re-solidifies. During the period up to $t_2$, the energy delivered to the silicon is sufficient to melt the silicon but not sufficient to cause it to ablate (vaporize).

The laser beam may also be stationary when using a pulsed laser with one or more pulses supplied over a given area, and with one of various beam spatial power profiles such as Gaussian or top hat and elongated beam spatial shapes such as a line laser. Similarly, it is preferable to shape the pulses temporally to abruptly reduce the power applied by the laser in the tail of the pulse.

On the other hand, to obtain a more uniform impurity distribution throughout the molten region it is preferable to increase the time during which the silicon remains molten to give the impurities more time to mix throughout the molten region. The period of time that the silicon remains molten should be long enough for the diffusion length of the given impurity type to be long relative to the depth of molten silicon This allows the impurity concentration to build up in the deepest sections of the molten silicon and hence allows the impurity profile to become more uniform. It is also preferable that the depth of the molten region is limited by restricting the energy of laser illumination rather than by restricting the time for which the silicon remains molten. When using a scanning approach, this may be achieved by elongating the spatial shape of the laser beam, using a line laser beam or using a slower scan speed or, when using a pulsed laser, increasing the temporal pulse length and/or number of pulses provided to a given area. In addition, the molten region should be re-crystallised sufficiently rapidly in relation to the diffusion coefficient of the given impurity type to restrict diffusion of the impurity type within the remaining molten silicon region using the previously mentioned methods, to reduce the effect of segregation and hence result in a relatively uniform impurity profile.

Figure 14A:
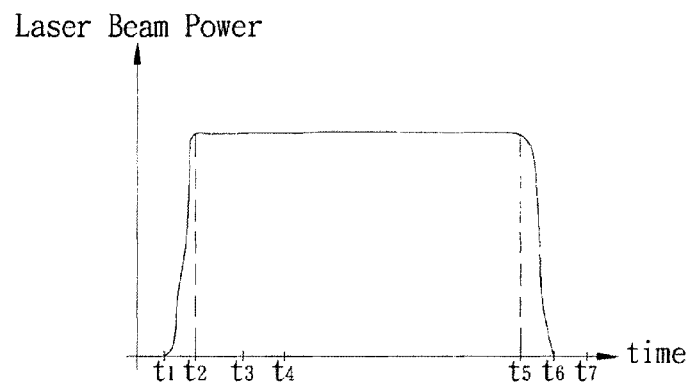
FIGS. 14 a, b, & c graphically show curves similar to those of FIG. 13 when the laser has a "Top Hat" spatial power profile and the beam is elongated in the direction of travel (relative to the beams in FIGS. 12 & 13)
Figure 14B:
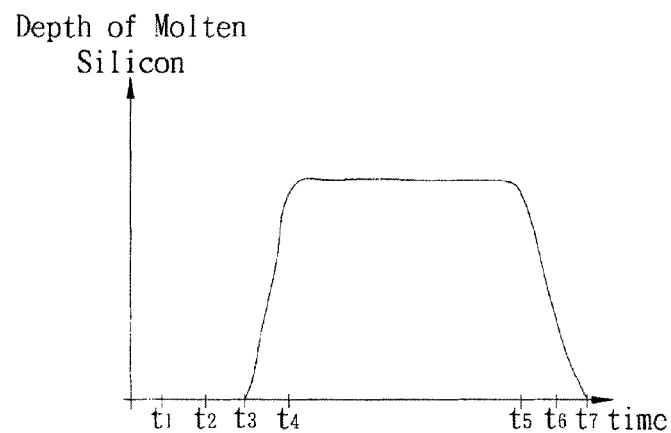

With reference to FIGS. 12, 13 and 14, when a CW laser with a spatially elongated beam is used as the heat source, with an approximate top-hat spatial power distribution in the direction of travel as it is scanned over the silicon, and operating with a linear scan speed, the power reaching a given point on the wafer under illumination as a function of time is as shown in FIG. 14a. It can be seen from FIG. 14a that the illumination of the given point on the silicon also follows an approximate top-hat distribution. The corresponding depth of molten silicon as a function of time is shown in FIG. 14b.

Figure 14C:
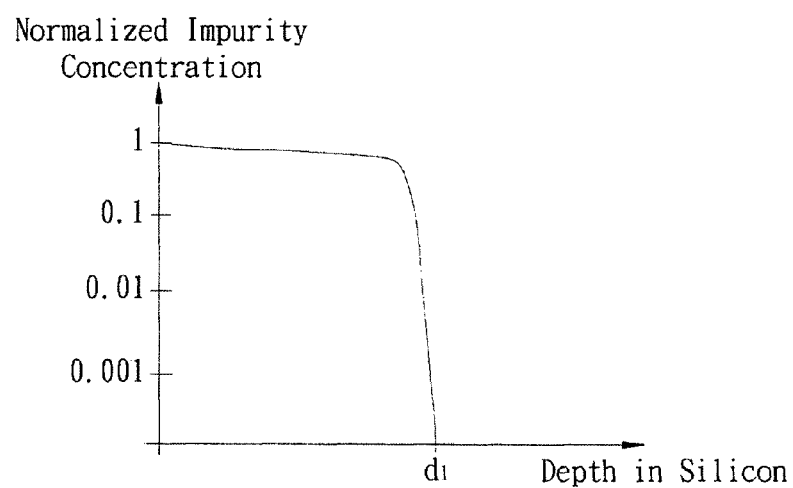

At time $t_1$, the laser illumination commences at the given position on the wafer; however the energy delivered is too low to melt the silicon. A short time later at time $t_2$, the power supplied to the silicon reaches an approximate maximum value and this power level is maintained until time $t_5$. The silicon continues to increase in temperature until time $t_3$ when the silicon at the surface of the wafer begins to melt. At time $t_4$ the molten silicon reaches its maximum depth ($d_1$) and is maintained at this depth until time $t_5$ when the power of the laser begins to decrease and the depth of molten silicon begins to decrease as the silicon solidifies. In this case, the time between $t_4$ and $t_5$ is substantially longer than that in the FIG. 13b example. A short time later at time t6 the illumination is completely removed from the given point on the silicon (i.e. the laser has moved past the point) and the silicon continues to re-solidify until time $t_7$ when all of the silicon has re-solidified. FIG. 14c shows a more uniform impurity spatial profile than achieved in FIGS. 12c and 13c, with the diffusion limited by the depth of the molten silicon; however the time for which the silicon remains molten is not sufficient for the impurity concentration to diffuse uniformly throughout the molten region. When the silicon is molten for a sufficiently long time by further increasing the time between t4 and t5, the diffusion length of the given impurity type will be sufficiently long in relation to the depth of silicon, to allow adequate diffusion of the impurity type to occur resulting in a uniform profile as shown in FIG. 14c.

Furthermore, when the impurity profiles of multiple types of impurities with sufficiently different diffusion coefficients within the molten silicon are controlled using the aforementioned techniques, it is possible to choose a length of time for which the silicon remains molten such that the diffusion length of one or more impurities is short in relation to the depth of molten silicon whilst the diffusion length of another one or more impurity types is long in relation to the depth of molten silicon. For example, with reference to FIGS. 13 and 14, when the impurity types used are phosphorus with a diffusion coefficient of $5.8 \times 10^{-8}$ m$^2$/s and nickel with a diffusion coefficient of $3.8 \times 10^{-9}$ m$^2$/s, the laser provides a 532 nm wavelength top-hat CW laser beam with an optical power of 13 W and scan speed of 0.5 m/s to produce a 10 micron deep molten region. This could result in an impurity profile of nickel similar to that shown in FIG. 12c. On the other hand, the impurity profile of phosphorus is much more uniform and limited by the depth of molten silicon similar to the profile shown in FIG. 14c.

In order to get an impurity profile that is predominantly determined by the segregation coefficients of the impurities, the cooling rate should be sufficiently slow relative to the diffusion coefficients such that as the silicon recrystallizes, the impurities can diffuse sufficiently throughout the remaining molten silicon. This avoids the accumulation of dopants around the molten/solid silicon interface caused by non-unity segregation coefficients, and hence results in a gradual increase in the impurity concentration throughout the molten region as the silicon recrystallizes at a rate that allows segregation to occur. In addition, by varying the cooling and hence solidification rate during the recrystallization process it is possible that areas of the molten silicon can be re-crystallised more rapidly and hence the impurity profile will be determined by the diffusion coefficients of the given impurity types, whilst the cooling rate in other areas of the molten silicon may be reduced and the impurity profile within such regions will be determined by the segregation coefficients. For example, assuming a source of impurities is introduced into the silicon during a laser doping step, in order to get a variation in the impurity concentration of the impurity at the surface less than 2 times higher than that at the greatest depth in the molten region, the diffusion length of the impurity needs to be greater than approximately 60% of the depth of molten silicon. For the case of phosphorus for a 10 micron deep volume of molten silicon, the time the silicon is molten for is larger than approximately 620 microseconds.

Figure 15A:
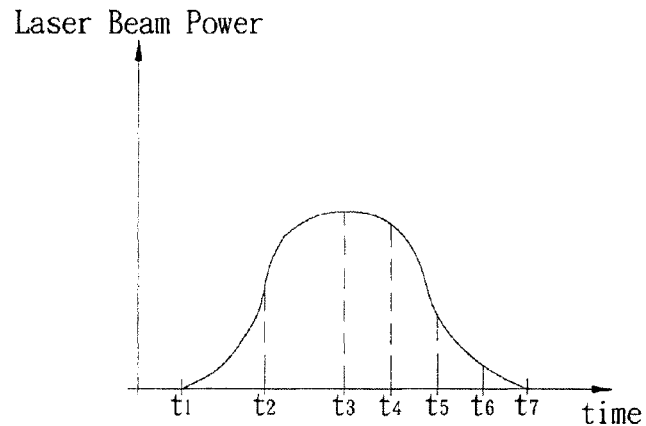
FIGS. 15 a, b, & c graphically show curves similar to those of FIG. 12 when the laser has a Gaussian spatial beam power profile in the direction of travel and is operated at a slower scan speed than the beam of FIG. 12.
Figure 15B:
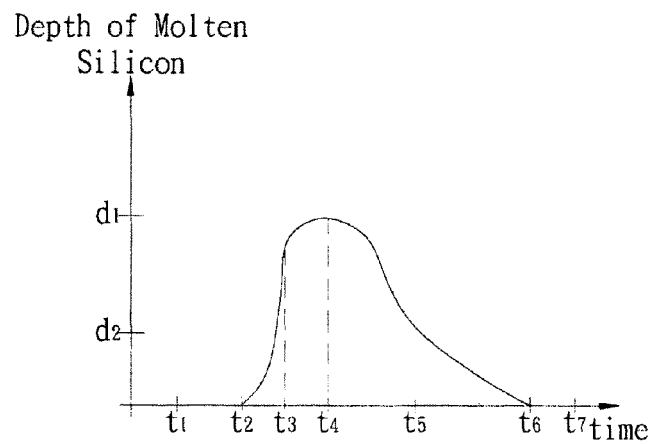
Figure 15C:
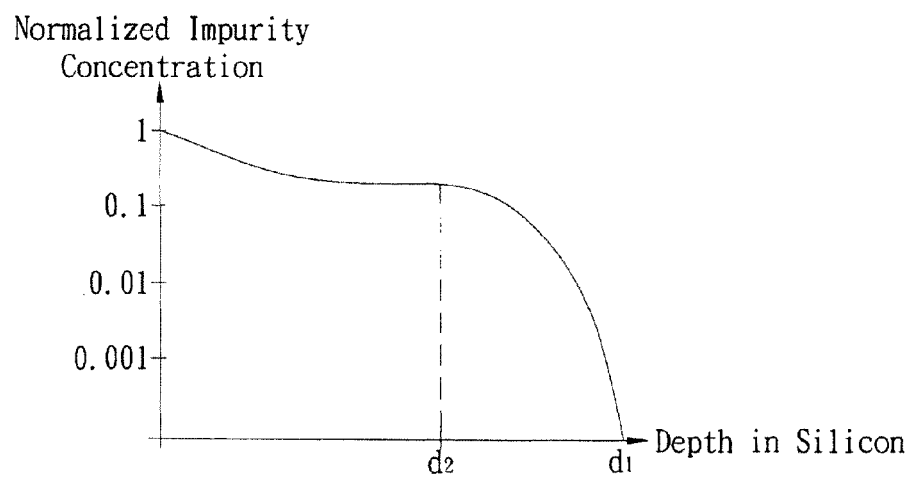

When using a CW or pseudo CW laser, a reduced cooling rate may be achieved by reducing the scan speed such as when using a phosphorus dopant source and a 13 W 532 nm CW laser with a Gaussian spatial beam profile, a beam diameter of 20 microns and scan speed of 0.5 m/s. However by using a slower scan speed, a deeper impurity profile may result. To compensate for this, the power of laser illumination may be reduced to determine the depth of the molten region. With reference to FIG. 15, in this example a laser is used which has the same Gaussian spatial beam power profile and laser properties as discussed in respect of the example of FIG. 12a, however the laser is now operated with a slower scan speed and hence there is a slower temporal decay of the beam over a given point on the silicon surface. The power reaching a given point on the wafer under illumination as a function of time also exhibits a Gaussian distribution as is shown in FIG. 15a. The corresponding depth of molten silicon as a function of time is shown in FIG. 15b. At time $t_1$, the laser illumination commences at the given position on the wafer; however the energy delivered is too low to melt silicon. At time $t_2$, the energy supplied to the silicon is sufficient to melt the surface of the silicon and as the power supplied by the laser continues to increase, the depth of molten silicon increases. At time $t_3$, the given position on the wafer is exposed to the peak power supplied by the laser and the depth of molten silicon is still increasing and continues to increase as the power supplied by the laser passes its peak and begins to decrease. At time $t_4$, the molten silicon reaches its maximum depth ($d_1$), which is deeper than that which occurs in the FIG. 12 example due to the slower scan speed of the laser in the FIG. 15 example. After time $t_4$ the silicon begins to solidify, and in this instance solidification is at a more rapid rate with the result that segregation effects are not observed. However the solidification rate has decreased at time $t_5$ with the depth of the molten region $d_2$ in FIG. 15b corresponding to the depth $d_2$ shown in the spatial diffusion profile in FIG. 15c, and segregation effects are visible in the resultant dopant profile. The silicon continues to solidify until time $t_6$ when all of the silicon has solidified and at $t_7$ the laser illumination is removed from the point on the silicon (i.e. the laser has moved past the point). FIG. 15c shows the typical spatial impurity diffusion profile for such a process.

Referring to FIG. 20, a graphical representation of a measured spatial diffusion profile using the beam parameters mentioned above with reference to FIG. 15 is shown for a scan speed of 0.5 m/s (2003). Also shown is a measured spatial diffusion profile using the same laser beam spatial profile and scan speed of 2 m/s (2002) which shows a less uniform mixing of the impurities throughout the molten region prior to solidification.

Figure 16A:
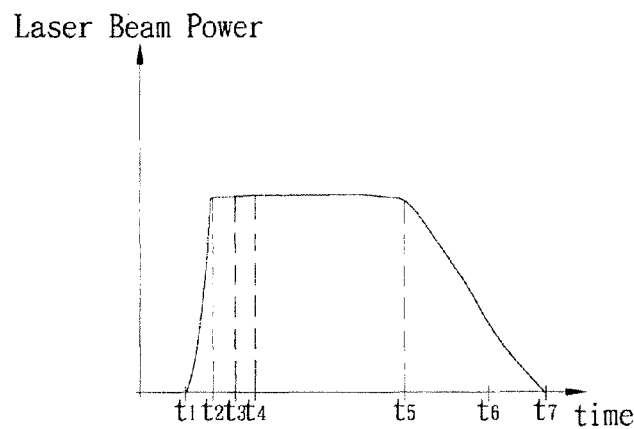
FIGS. 16 a, b, & c graphically show curves similar to those of FIG. 12 when the laser has a spatial beam power profile having a slower decay in the tail (in the direction of travel) than the beam of FIG. 12.
Figure 16B:
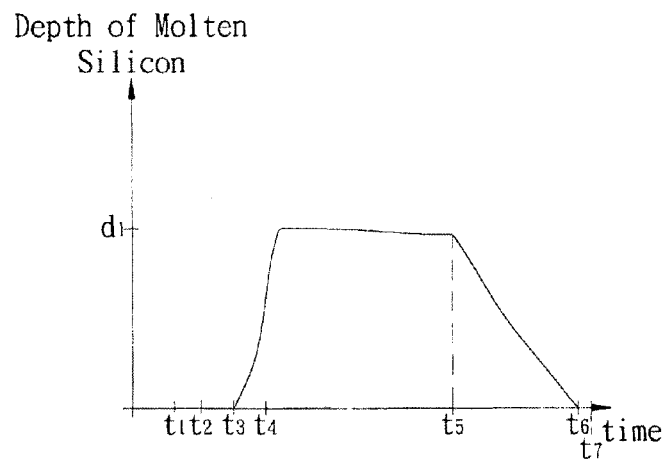
Figure 16C:
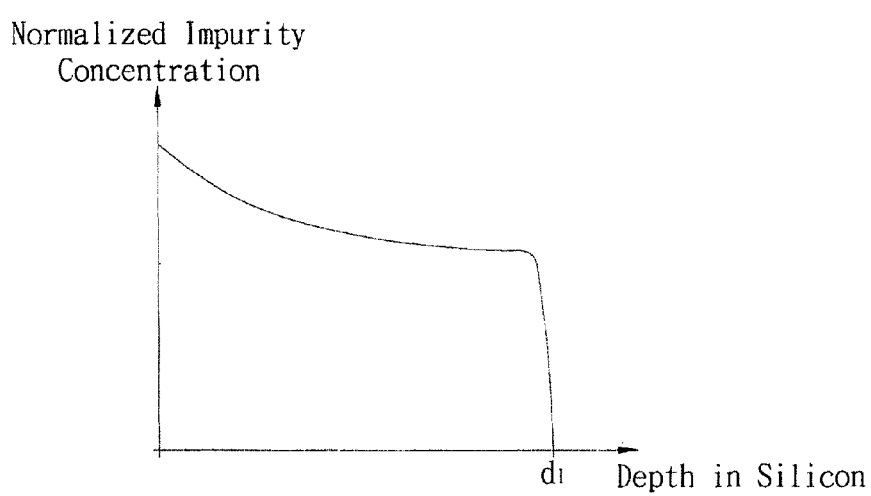

Alternatively, a slower rate of solidification can be achieved by extending the tail of the beam in the direction of travel. With reference to the example of FIG. 16, a CW laser is used which has an elongated beam, an approximately uniform peak power and long spatial power decay in the direction of travel of a CW laser beam. The power reaching a given point on the wafer under illumination as a function of time is shown in FIG. 16a. At time $t_1$, the laser illumination commences at the given position on the wafer; however the energy delivered is too low to melt the silicon. A short time later at time $t_2$, the power supplied to the silicon reaches an approximate maximum value, which is maintained until time $t_4$. At time $t_2$ the silicon is continuing to increase in temperature, and continues to do so until time $t_3$ when the silicon at the surface of the wafer begins to melt. At time $t_4$ the molten silicon reaches its maximum depth ($d_1$) and is maintained at this depth for an extended period of time to create a relatively uniform doping profile, until time $t_5$ when the power of the laser begins to decrease slowly and the depth of molten silicon also begins to decrease slowly as the silicon solidifies. At time $t_6$ the silicon has completely solidified and at time $t_7$ the laser illumination is removed from the given point (i.e. the laser has moved past the point). FIG. 16c shows a spatial doping profile predominately determined by segregation assuming an approximately uniform doping profile throughout the molten silicon prior to solidification.

When using a pulsed laser, the cooling rate may be reduced by altering the temporal power profile of the pulse to more gradually reduce the power applied by the laser in the tail of the pulse. Similarly, such effects may be achieved for CW laser beams by using a stationary laser beam and using shutters in the beam path to control the temporal beam power profile reaching the semiconductor surface.

Furthermore, when multiple impurity types are present in the molten silicon, it is possible that during recrystallization, the spatial profile of one or more impurity types with relatively low diffusion coefficients can be predominately determined by the diffusion coefficient of the given impurity type, whilst the spatial profile of other impurity types with higher diffusion coefficients can be predominately determined by the segregation coefficients of their respective impurity types.

Figure 19A:
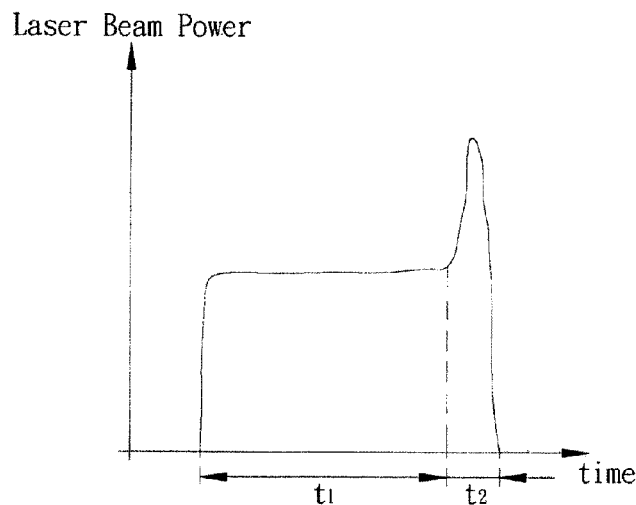
FIG. 19 graphically shows a) a beam temporal power profile of a pulsed laser with a time varying pulse power which can be used to perform a two stage melt of the silicon; and b) the resultant spatial impurity profile (impurity concentration versus depth normalised to unity at the surface) after the silicon has solidified.
Figure 19B:
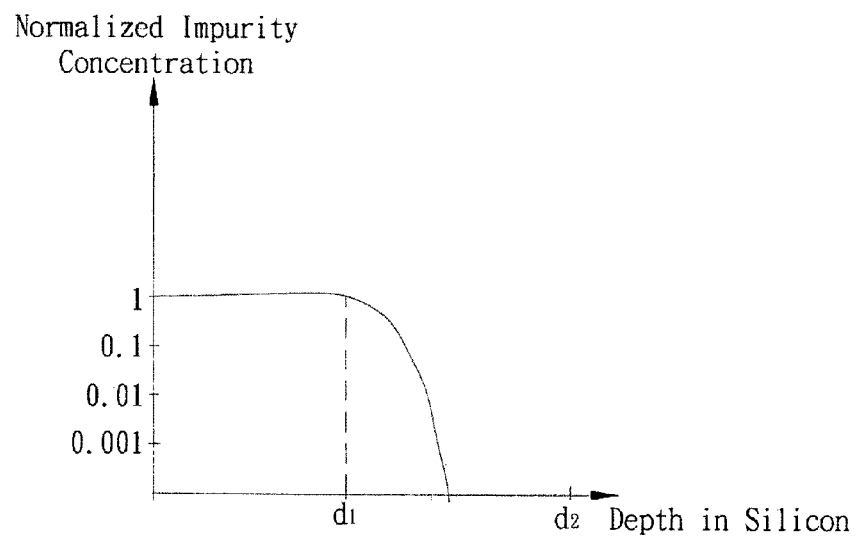

The temporal power profile of the laser may also be varied during the period of melting. With reference to FIG. 19, a pulsed laser may be used to provide a temporal pulse power profile as shown in FIG. 19a, which provides a first energy of illumination for a predetermined period of time $t_1$ to allow the silicon to melt to a given depth for the first molten region (d1) and which provides for sufficient mixing of the given impurity type within the first molten region. Subsequently the power of the illumination may be increased for a short period of time t2 after the first predetermined period to cause an increase in the volume of the molten region beyond the first molten region to a depth d2, but distribution of the given impurity within this newly molten volume beyond the first, molten region will be limited by the diffusion length of the given impurity type relative to the increased depth of the newly molten region and the time that the newly molten region remains molten. The laser power may then be reduced to rapidly cool and solidify the newly molten region beyond the first molten region to prevent segregation. In this example the rapid cooling and solidification is also continued through all of the first molten region to result in a uniform impurity profile within the first molten region, resulting in an impurity spatial profile as shown in FIG. 19b. Similarly when using a CW or pseudo CW laser beam, the use of spatially shaping of the laser beam or locating shutters in the beam path can be employed to allow such heating/cooling regimes to be achieved as the laser is scanned over a given region of the semiconductor surface.

It will be appreciated by persons skilled in the art that numerous variations and/or modifications may be made to the invention as shown in the specific embodiments without departing from the scope of the invention as broadly described. The present embodiments are, therefore, to be considered in all respects as illustrative and not restrictive.

The invention claimed is:

1. A method of creating an impurity spatial distribution profile in a substrate comprising crystalline silicon material having an initial background doping of a first impurity type, the impurity spatial distribution profile extending inwardly from a surface of the substrate, the method comprising:
   a) providing one or more impurity sources in addition to the background doping of the substrate, the one or more impurity sources in combination containing at least two different types of impurity atoms, each of the one or more impurity sources being within the substrate or in proximity to the surface of the substrate and each of the at least two different types of impurity atom having a different diffusion coefficient or a different segregation coefficient;
   b) locally heating the silicon material and the one or more impurity sources within the substrate or in proximity to the surface of the substrate by applying a laser heat source to heat a point on the surface of the substrate to melt a volume of the silicon material below the point on the surface of the substrate whereby the at least two different types of impurity atoms of the at least one source are incorporated into the melted silicon material;
   c) cooling the melted silicon material by removing the heat source from the point on the surface of the substrate to allow the melted silicon material to recrystallise;
   d) controlling a rate of application and/or removal of the laser heat source and a duration for which the heat source is applied to thereby control the rate and depth of melting, a duration for which the silicon remains molten and a rate of recrystallisation of the silicon material to control redistribution of the at least two types of impurity atoms within the melted silicon by diffusion while melted or by segregation during recrystallisation to thereby create the impurity distribution profile of each of the at least two types of impurity atom in the recrystallised silicon material comprising a different distribution profile of each of the at least two types of impurity atom;
   wherein the one of the at least two different types of impurity atoms is nickel and the cooling step is controlled whereby the segregation coefficient of the nickel during solidification ensures minimal metal contamination occurs within the silicon material that is first to crystallise but with very high concentration of metal atoms within the silicon material that is last to crystallise, and
   wherein the method further comprises reconfiguring the metal atoms to form NiSi that acts as a diffusion barrier to copper and will nucleate copper plating.

2. The method of claim 1 wherein either:
   i) all of the at least two impurity atom types are of a different type to the first impurity type; or
   ii) the at least one impurity source comprises a source of the first impurity type in addition to the background doping of the substrate.

3. The method of claim 1 wherein during the heating step the melted silicon material extends to a depth whereby diffusion of dopants from the melted silicon material reaches a buried layer to cause a connection between the buried layer and the melted silicon material after recrystallisation of the melted silicon material and forming a junction between the melted silicon material and oppositely doped material surrounding the melted silicon material after its recrystallisation.

4. The method of claim 3 wherein contact to the underlying region is made through an emitter or surface layer by forming a molten region through the emitter or surface layer such that upon recrystallization the molten region forms a region of opposite polarity to the surface layer so as to form contact to the underlying region also of opposite polarity to the emitter or surface layer.

5. The method of claim 4 wherein the contact to the underlying region is used to form an interdigitated contact structure or a contact through a floating junction.

6. The method of claim 3 wherein the regions of recrystallised melted silicon material connect parallel layers of the same polarity located at different distances from the surface of the substrate.

7. The method of claim 6 wherein the regions of recrystallised melted silicon material are formed to connect a silicon region at one surface of the substrate to a silicon region at an opposite surface of the substrate, the substrate comprising a wafer or silicon layer of less than 20 microns thickness.

8. The method of claim 6 wherein two regions of recrystallised melted silicon material are formed extending from opposite surfaces of the substrate to interconnect with each other to connect a silicon region at one surface of the substrate to a silicon region at the opposite surface of the substrate, the substrate comprising a wafer or silicon layer of less than 40 microns thickness.

9. The method of claim 1 wherein the different spatial distribution profile of each of the at least two types of impurity atoms in the recrystallised silicon material results in a reduction in an impurity concentration of at least one impurity type in at least a part of the melted material after recrystallization from the average concentration of the impurity within the molten silicon.

10. The method of claim 9 wherein an impurity spatial distribution profile of one of the at least two different types of impurity atoms is controlled to minimise its concentration near a junction and to maximise its concentration near the surface of the melted region after recrystallisation.

11. The method of claim 1 wherein the reconfiguring of the metal atoms comprises performing, after recrystallization, a thermal anneal at 350-400° C.

12. The method of claim 1 wherein the reconfiguring of the metal atoms comprises controlling removal of the laser heat source used to heat the point on the surface of the substrate to melt the volume of the silicon material.

13. The method of claim 1 wherein during the heating step the region of melted silicon material extends to a depth of at least 4 μm below the point on the surface of the substrate.

14. The method of claim 13 wherein the localised regions of melted silicon material are used to form heavily doped regions beneath metal contacts.

15. A method of creating an impurity spatial distribution profile in a substrate comprising crystalline silicon material having an initial background doping of a first impurity type, the impurity spatial distribution profile extending inwardly from a surface of the substrate, the method comprising:
   a) providing one or more impurity sources in addition to the background doping of the substrate, the one or more impurity sources in combination containing at least two different types of impurity atoms, each of the one or more impurity sources being within the substrate or in proximity to the surface of the substrate and each of the at least two different types of impurity atom having a different diffusion coefficient or a different segregation coefficient;
   b) locally heating the silicon material and the one or more impurity sources within the substrate or in proximity to the surface of the substrate by applying a laser heat source to heat a point on the surface of the substrate to melt a volume of the silicon material below the point on the surface of the substrate whereby the at least two different types of impurity atoms of the at least one source are incorporated into the melted silicon material;
   c) cooling the melted silicon material by removing the heat source from the point on the surface of the substrate to allow the melted silicon material to recrystallise;
   d) controlling a rate of application and/or removal of the laser heat source, and a duration for which the heat source is applied, to thereby control the rate and depth of melting, a duration for which the silicon remains molten and a rate of recrystallisation of the silicon material, to thereby control redistribution of the at least two types of impurity atoms within the melted silicon by diffusion while melted or by segregation during recrystallisation, to thereby create the impurity distribution profile of each of the at least two types of impurity atom in the recrystallised silicon material comprising a different distribution profile of each of the at least two types of impurity atom,
   wherein the local heating of the silicon material comprises:
      i) operating the laser to provide a first beam power for a first predetermined period of time to allow for sufficient mixing of one of the at least two different types of the impurity atoms within a first molten region at the given point;
      ii) increasing the beam power of the laser for a period of time after the first predetermined period to cause an increase in the volume of the molten region beyond the first molten region, wherein distribution of the one of the at least two different types of the impurity atoms within this newly molten volume beyond the first molten region is limited by the diffusion coefficients of the respective impurity; and
      iii) reducing the beam power of the laser to rapidly cool part or all of the newly molten volume beyond the first molten region at a rate to prevent segregation of the one of the at least two different types of the impurity atoms and to ensure that the diffusion coefficients determine an impurity spatial profile of the one of the at least two different types of the impurity atoms in part or all of the increased molten volume beyond the first molten region.

16. The method of claim 15 wherein the rapid cooling is continued while a part of the first molten region cools to result in a uniform impurity spatial profile of the one of the at least two different types of the impurity atoms between the first molten region and the increased molten area.

17. The method of claim 15 wherein during solidification of the first molten region, the cooling rate is reduced whereby a part of the impurity spatial profile of the one of the at least two different types of the impurity atoms in the first molten region is determined by the segregation coefficient of the one of the at least two different types of the impurity atoms.

18. The method of claim 15 wherein the laser is a pulsed laser and the laser power for a pulse is varied temporally by shaping a temporal power profile of the laser pulse.

19. The method of claim 15 wherein the laser is a pseudo CW laser and the beam power of the laser is varied temporally by varying a temporal power profile of a pulse train of the laser pulses.

20. The method of claim 15 wherein the laser is a pseudo CW laser and the beam power of the laser is varied temporally by varying a pulse frequency during a train of essentially identical pulses.

21. The method of claim 15 wherein the laser is a pseudo CW laser and the beam power of the laser is varied temporally by controlling a shutter.

22. The method of claim 15 wherein the laser is a pseudo CW laser and the beam power as experienced by a point on the surface of the substrate is varied temporally by moving the beam relative to the point on the surface and spatially shaping the beam in the direction of relative travel.

23. The method of claim 15 wherein the laser is a CW laser and the beam power is varied temporally by shaping the temporal power profile of the beam of the laser using a shutter.

24. The method of claim 15 wherein the laser is a CW laser and the beam power as experienced by a point on the surface of the substrate is varied temporally by moving the beam relative to the point on the surface and spatially shaping the beam in the direction of relative travel.

25. A method of creating an impurity spatial distribution profile in a substrate comprising crystalline silicon material having an initial background doping of a first impurity type, the impurity spatial distribution profile extending inwardly from a surface of the substrate, the method comprising:
   a) providing one or more impurity sources in addition to the background doping of the substrate, the one or more impurity sources in combination containing at least two different types of impurity atoms, each of the one or more impurity sources being within the substrate or in proximity to the surface of the substrate and each of the at least two different types of impurity atom having a different diffusion coefficient or a different segregation coefficient;
   b) locally heating the silicon material and the one or more impurity sources within the substrate or in proximity to the surface of the substrate by applying a laser heat source to heat a point on the surface of the substrate to melt a volume of the silicon material below the point on the surface of the substrate whereby the at least two different types of impurity atoms of the at least one source are incorporated into the melted silicon material;

c) cooling the melted silicon material by removing the heat source from the point on the surface of the substrate to allow the melted silicon material to recrystallise;
d) controlling a rate of application and/or removal of the laser heat source, and a duration for which the heat source is applied, to thereby control the rate and depth of melting, a duration for which the silicon remains molten and a rate of recrystallisation of the silicon material, to thereby control redistribution of the at least two types of impurity atoms within the melted silicon by diffusion while melted or by segregation during recrystallisation, to thereby create the impurity distribution profile of each of the at least two types of impurity atom in the recrystallised silicon material comprising a different distribution profile of each of the at least two types of impurity atom, wherein a rate of solidification of a molten region of the silicon is varied such that during a first part of the solidification process the solidification occurs at a rate fast enough in relation to the diffusion coefficient of one of the at least two different types of the impurity atoms that segregation cannot occur, and in other parts of the solidification process the solidification occurs at a rate slow enough in relation to the diffusion coefficient of the one of the at least two different types of the impurity atoms that segregation can occur.

* * * * *